US012777801B2

(12) United States Patent
Kim et al.

(10) Patent No.: US 12,777,801 B2
(45) Date of Patent: Oct. 27, 2026

(54) DISPLAY DEVICE, DISPLAY SYSTEM, AND ELECTRONIC DEVICE

(71) Applicant: Samsung Display Co., LTD., Yongin-si (KR)

(72) Inventors: Kyung Bae Kim, Yongin-si (KR); Dong Woo Kim, Yongin-si (KR); Yeon Kyung Kim, Yongin-si (KR); Yong Hee Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/185,687

(22) Filed: Apr. 22, 2025

(65) Prior Publication Data

US 2025/0386691 A1 Dec. 18, 2025

(30) Foreign Application Priority Data

Jun. 17, 2024 (KR) ........................ 10-2024-0078154
Oct. 18, 2024 (KR) ........................ 10-2024-0143075

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0819* (2013.01); *G09G 2300/0852* (2013.01); *G09G 2300/0861* (2013.01)

(58) Field of Classification Search
CPC ............... H10K 59/131; G09G 3/3233; G09G 2300/0819; G09G 2300/0852; G09G 2300/0861
See application file for complete search history.

(56) References Cited

U.S. PATENT DOCUMENTS 10,950,679 B1 * 3/2021 Jin .......................... G09G 3/20
10,971,073 B2 4/2021 Kimura
11,217,143 B2 1/2022 Lin et al.
2021/0295755 A1 * 9/2021 Lin .......................... G09G 3/20
2022/0344428 A1 * 10/2022 Wu .................... H10K 59/1201

FOREIGN PATENT DOCUMENTS

JP 7405214 B2 12/2023

* cited by examiner

*Primary Examiner* — Douglas Wilson
(74) *Attorney, Agent, or Firm* — Womble Bond Dickinson (US) LLP

(57) ABSTRACT

According to one or more embodiments of the disclosure, a display device may include a display panel including sub-pixels electrically connected to gate lines, data lines, and auxiliary data lines, a gate driver on a side of the display panel, and configured to output gate signals to the gate lines, and a data driver configured to output data signals to the data lines through the auxiliary data lines.

20 Claims, 16 Drawing Sheets

DISPLAY DEVICE, DISPLAY SYSTEM, AND ELECTRONIC DEVICE

CROSS-REFERENCE TO RELATED APPLICATION

The present application claims priority to, and the benefit of, Korean Patent Application No. 10-2024-0078154, filed on Jun. 17, 2024, and Korean Patent Application No. 10-2024-0143075, filed on Oct. 18, 2024, in the Korean Intellectual Property Office, the entire disclosure of which is incorporated herein by reference.

BACKGROUND

1. Field

The disclosure relates to a display device and a display system.

2. Description of the Related Art

As information technology develops, importance of a display device, which is a connection medium between a user and information, is emerging. Accordingly, research and development on a display device are continuously being conducted. Recently, as a type of a display device, a display device that provides virtual reality (VR) and augmented reality (AR) is being developed.

For example, in the display device that provides VR and AR, a user may feel dizzy in case that a size of a display panel is not appropriate.

SUMMARY

An aspect of the disclosure provides a display device, and a display system having a display panel capable of appropriately providing virtual reality and augmented reality.

An aspect of the disclosure provides a display device, and a display system with a reduced manufacturing cost.

According to one or more embodiments of the disclosure, a display device may include a display panel including sub-pixels electrically connected to gate lines, data lines, and auxiliary data lines, a gate driver on a side of the display panel, and configured to output gate signals to the gate lines, and a data driver configured to output data signals to the data lines through the auxiliary data lines.

The data driver may be on the side of the display panel on which the gate driver is located, or is on another side of the display panel that is opposite to the one side.

The display panel may have a long side extending in a first direction, and a short side extending in a second direction crossing the first direction, wherein the data driver is on the short side.

The gate lines and the auxiliary data lines may extend in the first direction, wherein the data lines extend in the second direction.

The data lines may be respectively electrically connected to at least one of the auxiliary data lines.

The data lines may include a first data line electrically connected to a first column of the sub-pixels, a second data line electrically connected to a second column of the sub-pixels, and a third data line electrically connected to a third column of the sub-pixels, wherein the auxiliary data lines include a first auxiliary data line electrically connected to the first data line, a second auxiliary data line electrically connected to the second data line, and a third auxiliary data line electrically connected to the third data line.

The data lines may include a first data line electrically connected to a first column of the sub-pixels, wherein one or more of the auxiliary data lines are electrically connected to the first data line through first contact holes.

A number of the data lines may correspond to a number of columns of the sub-pixels, wherein a number of the auxiliary data lines is a positive integer multiple of the number of the columns.

The display panel may include a silicon substrate.

The display device may be configured to provide virtual reality (VR) or augmented reality (AR).

According to one or more embodiments of the disclosure, a display device may include a display panel having a long side extending in a first direction, and a short side extending in a second direction crossing the first direction, and including sub-pixels electrically connected to gate lines, auxiliary data lines extending in the first direction, and data lines extending in the second direction, and electrically connected to the auxiliary data lines through contact holes, a gate driver on the short side of the display panel, and electrically connected to the gate lines, and a data driver on the short side of the display panel or on a side of the display panel that is opposite to the short side, and electrically connected to the data lines.

The data lines may include a first data line electrically connected to a first column of the sub-pixels, wherein one or more of the auxiliary data lines are electrically connected to the first data line through first contact holes.

A number of the data lines may correspond to a number of columns of the sub-pixels, wherein a number of the auxiliary data lines is a positive integer multiple of the number of the columns.

The display panel may include a silicon substrate.

The display device may be configured to provide virtual reality (VR) or augmented reality (AR).

According to one or more embodiments of the disclosure, an electronic device may include a display system including a processor, and a display device including a display panel including sub-pixels electrically connected to gate lines, data lines, and auxiliary data lines, a gate driver on a side of the display panel and configured to output gate signals to the gate lines, and a data driver parallel to the gate driver and configured to output data signals to the data lines through the auxiliary data lines.

The data driver may be on the side of the display panel on which the gate driver is located, or is on another side of the display panel that is opposite to the one side.

The display panel may have a long side extending in a first direction, and a short side extending in a second direction crossing the first direction, wherein the data driver is on the short side.

The gate lines and the auxiliary data lines may extend in the first direction, wherein the data lines extend in the second direction.

The data lines may be respectively electrically connected to at least one of the auxiliary data lines.

According to one or more embodiments of the disclosure, a display device, and a display system having a display panel capable of appropriately providing virtual reality and augmented reality, may be provided.

According to one or more embodiments of the disclosure, a display device and a display system with a reduced manufacturing cost may be provided.

BRIEF DESCRIPTION OF THE DRAWINGS

The above and other aspects of the disclosure will become more apparent by describing in further detail embodiments thereof with reference to the accompanying drawings, in which.

DETAILED DESCRIPTION

Figure 1:
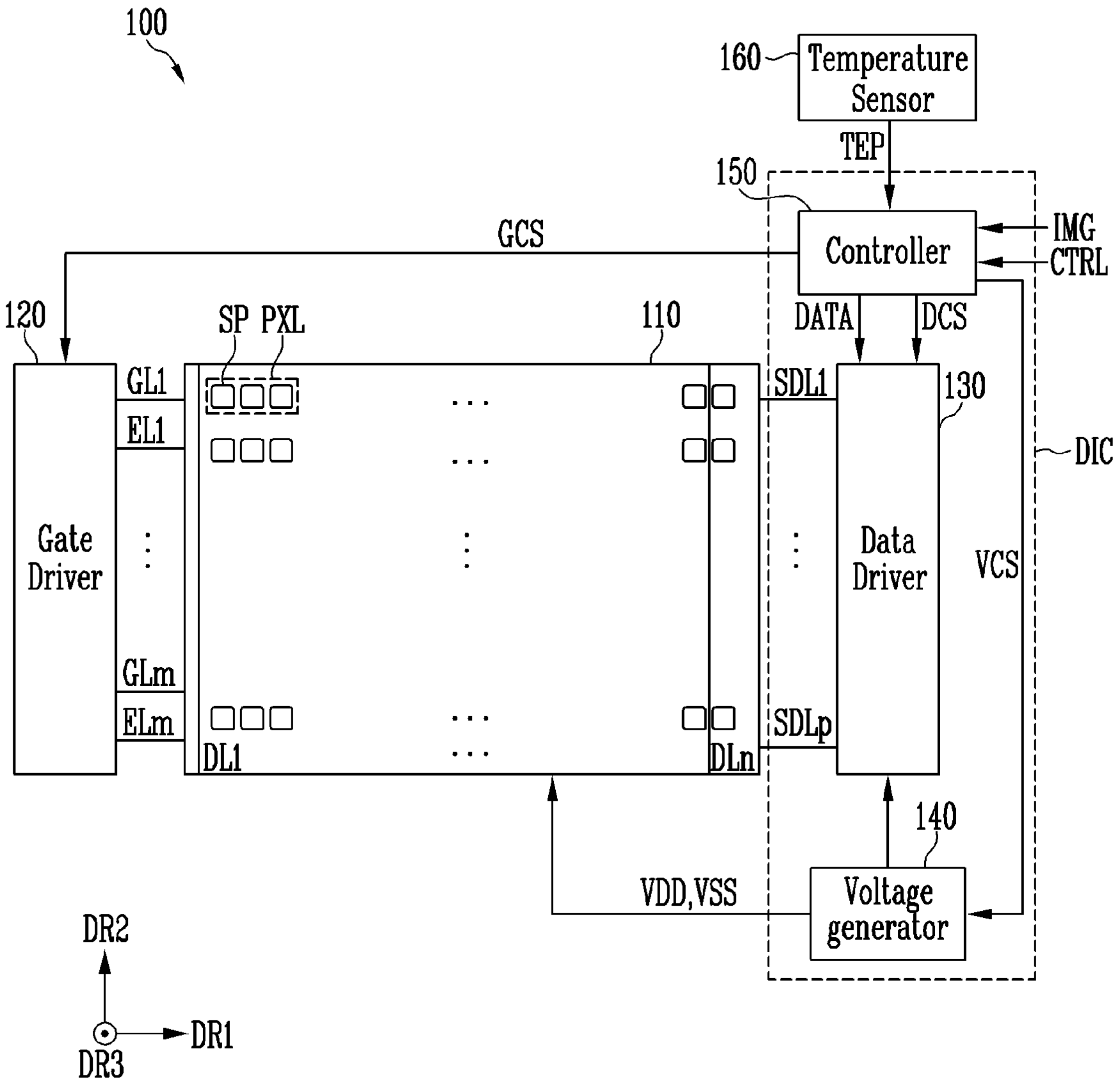
FIG. 1 is a schematic block diagram illustrating one or more embodiments of a display device.

Aspects of some embodiments of the present disclosure and methods of accomplishing the same may be understood more readily by reference to the detailed description of embodiments and the accompanying drawings. The described embodiments are provided as examples so that this disclosure will be thorough and complete, and will fully convey the aspects of the present disclosure to those skilled in the art. Accordingly, processes, elements, and techniques that are redundant, that are unrelated or irrelevant to the description of the embodiments, or that are not necessary to those having ordinary skill in the art for a complete understanding of the aspects of the present disclosure may be omitted. Unless otherwise noted, like reference numerals, characters, or combinations thereof denote like elements throughout the attached drawings and the written description, and thus, repeated descriptions thereof may be omitted.

The described embodiments may have various modifications and may be embodied in different forms, and should not be construed as being limited to only the illustrated embodiments herein. The use of "can," "may," or "may not" in describing an embodiment corresponds to one or more embodiments of the present disclosure.

A person of ordinary skill in the art would appreciate, in view of the present disclosure in its entirety, that each suitable feature of the various embodiments of the present disclosure may be combined or combined with each other, partially or entirely, and may be technically interlocked and operated in various suitable ways, and each embodiment may be implemented independently of each other or in conjunction with each other in any suitable manner unless otherwise stated or implied.

In the drawings, the relative sizes of elements, layers, and regions may be exaggerated for clarity and/or descriptive purposes. In other words, because the sizes and thicknesses of elements in the drawings are arbitrarily illustrated for convenience of description, the disclosure is not limited thereto. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result of, for example, manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of elements, layers, or regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Spatially relative terms, such as "beneath," "below," "lower," "lower side," "under," "above," "upper," "over," "higher," "upper side," "side" (e.g., as in "sidewall"), and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component (e.g., an apparatus, a device, a circuit, a wire, an electrode, a terminal, a conductive film, etc.) is referred to as being "formed on," "on," "connected to," or "(operatively, functionally, or communicatively) coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or one or more intervening layers, regions, or components may be present. The one or more intervening components may include a switch, a transistor, a resistor, an inductor, a capacitor, a diode and/or the like. Accordingly, a connection is not limited to the connections illustrated in the drawings or the detailed description and may also include other types of connections. In describing embodiments, an expression of connection indicates electrical connection unless explicitly described to be direct connection, and "directly connected/directly coupled," or "directly on," refers to one component directly connecting or coupling another component, or being on another component, without an intermediate component.

In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components, such as "between," "immediately between" or "adjacent to" and "directly adjacent to," may be construed similarly. It will be understood that when an element or layer is referred to as being "between" two elements or layers, it can be the only element or layer between the two elements or layers, or one or more intervening elements or layers may also be present.

For the purposes of this disclosure, expressions such as "at least one of," or "any one of," or "one or more of" when preceding a list of elements, modify the entire list of elements and do not modify the individual elements of the list. For example, "at least one of X, Y, and Z," "at least one of X, Y, or Z," "at least one selected from the group consisting of X, Y, and Z," and "at least one selected from the group consisting of X, Y, or Z" may be construed as X only, Y only, Z only, any combination of two or more of X, Y, and Z, such as, for instance, XYZ, XY, YZ, and XZ, or any variation thereof. Similarly, the expressions "at least one of A and B" and "at least one of A or B" may include A, B, or A and B. As used herein, "or" generally means "and/or," and the term "and/or" includes any and all combinations of one or more of the associated listed items. For example, the expression "A and/or B" may include A, B, or A and B. Similarly, expressions such as "at least one of," "a plurality of," "one of," and other prepositional phrases, when preceding a list of elements, modify the entire list of elements and do not modify the individual elements of the list. When "C to D" is stated, it means C or more and D or less, unless otherwise specified.

It will be understood that, although the terms "first," "second," "third," etc., may be used herein to describe various elements, components, regions, layers and/or sections, these elements, components, regions, layers and/or sections should not be limited by these terms. These terms do not correspond to a particular order, position, or superiority, and are only used to distinguish one element, member, component, region, area, layer, section, or portion from another element, member, component, region, area, layer, section, or portion. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing embodiments only and is not intended to be limiting of the present disclosure. As used herein, the singular forms "a" and "an" are intended to include the plural forms as well, while the plural forms are also intended to include the singular forms, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the terms "substantially," "about," "approximately," and similar terms are used as terms of approximation and not as terms of degree, and are intended to account for the inherent deviations in measured or calculated values that would be recognized by those of ordinary skill in the art. For example, "substantially" may include a range of +/−5% of a corresponding value. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure." Furthermore, the expression "being the same" may mean "being substantially the same". In other words, the expression "being the same" may include a range that can be tolerated by those of ordinary skill in the art. The other expressions may also be expressions from which "substantially" has been omitted.

In some embodiments well-known structures and devices may be described in the accompanying drawings in relation to one or more functional blocks (e.g., block diagrams), units, and/or modules to avoid unnecessarily obscuring various embodiments. Those skilled in the art will understand that such block, unit, and/or module are/is physically implemented by a logic circuit, an individual component, a microprocessor, a hard wire circuit, a memory element, a line connection, and other electronic circuits. This may be formed using a semiconductor-based manufacturing technique or other manufacturing techniques. The block, unit, and/or module implemented by a microprocessor or other similar hardware may be programmed and controlled using software to perform various functions discussed herein, optionally may be driven by firmware and/or software. In addition, each block, unit, and/or module may be implemented by dedicated hardware, or a combination of dedicated hardware that performs some functions and a processor (for example, one or more programmed microprocessors and related circuits) that performs a function different from those of the dedicated hardware. In addition, in some embodiments, the block, unit, and/or module may be physically separated into two or more interact individual blocks, units, and/or modules without departing from the scope of the present disclosure. In addition, in some embodiments, the block, unit and/or module may be physically combined into more complex blocks, units, and/or modules without departing from the scope of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic block diagram illustrating one or more embodiments of a display device.

Referring to FIG. 1, the display device 100 may include a display panel 110, a gate driver 120, a data driver 130, a voltage generator 140, and a controller 150.

The display panel 110 includes sub-pixels SP. The sub-pixels SP may be electrically connected to first to m-th gate lines GL1 to GLm, first to n-th data lines DL1 to DLn, and first to p-th auxiliary data lines DSL to SDLp. The sub-pixels SP may be connected to the gate driver 120 through the first to m-th gate lines GL1 to GLm. The sub-pixels SP may be connected to the data driver 130 through the first to n-th data lines DL1 to DLn and the first to p-th auxiliary data lines SDL1 to SDLp.

The display panel 110 may be formed as a plane of a quadrangular shape having a long side of a first direction DR1, and a short side of a second direction DR2 crossing the first direction DR1. The display panel 110 of the disclosure may be a panel of a landscape shape in which a side of the first direction DR1 (for example, a horizontal direction side) is longer than a side of the second direction DR2 (for example, a vertical direction side).

Hereinafter, the first direction DR1 may be a "horizontal" direction as a row direction of the sub-pixels SP. The second direction DR2 may be a column direction of the sub-pixels SP. A third direction DR3 may be a display direction of the display device 100.

Each of the sub-pixels SP may include at least one light-emitting element configured to generate light. Accordingly, each of the sub-pixels SP may generate light of a corresponding color such as red, green, blue, cyan, magenta, or yellow. Two or more sub-pixels among the sub-pixels SP may configure one pixel PXL. For example, as shown in FIG. 1, three sub-pixels may configure one pixel PXL.

The gate driver 120 is connected (for example, electrically connected) to the sub-pixels SP arranged in a row direction through the first to m-th gate lines GL1 to GLm. The gate driver 120 may be electrically connected to the first to m-th gate lines GL1 to GLm, and the gate driver 120 may output gate signals to the first to m-th gate lines GL1 to GLm in response to a gate control signal GCS. In embodiments, the gate control signal GCS may include a start signal indicating a start of each frame, a horizontal synchronization signal for outputting the gate signals in synchronization with a timing at which data signals are applied, and the like.

In embodiments, first to m-th emission control lines EL1 to ELm connected (for example, electrically connected) to the sub-pixels SP of the row direction may be further provided. In this case, the gate driver 120 may include an emission control driver configured to control the first to m-th emission control lines EL1 to ELm, and the emission control driver may operate under control of the controller 150.

The gate driver 120 may be adjacent to the short side of the display panel 110. For example, the gate driver 120 may be located on a side of the short side of the display panel 110 (for example, at least one of a side adjacent to a left short side or a side adjacent to a right short side). For example, the gate driver 120 may be located on a left side or a right side of the display panel 110. However, embodiments are not limited thereto. For example, the gate driver 120 may be divided into two or more drivers that are physically and/or logically divided, and such drivers may be located on a side adjacent to the short side of the display panel 110 (for example, the side adjacent to the left short side) and another side of the display panel 110 opposite to the side (for example, the side adjacent to the right short side). As described above, the gate driver 120 may be located on a periphery of the display panel 110 in various forms according to embodiments.

The data driver 130 is connected (for example, electrically connected) to the sub-pixels SP located in the column direction through the first to n-th data lines DL1 to DLn and the first to p-th auxiliary data lines SDL1 to SDLp. The data driver 130 may be electrically connected to the first to p-th auxiliary data lines SDL1 to SDLp, and the first to p-th auxiliary data lines SDL1 to SDLp extending in the row direction of the sub-pixels SP may be electrically connected to the first to n-th data lines DL1 to DLn extending in the column direction of the sub-pixels SP. The data driver 130 receives image data DATA and a data control signal DCS from the controller 150. The data driver 130 operates in response to the data control signal DCS. In embodiments, the data control signal DCS may include a source start pulse, a source shift clock, a source output enable signal, and the like.

The data driver 130 may be electrically connected to the first to n-th data lines DL1 to DLn, and the data driver 130 may apply data signals having grayscale voltages corresponding to image data DATA to the first to n-th data lines DL1 to DLn through the first to p-th auxiliary data lines SDL1 to SDLp by using voltages from the voltage generator 140. The data signals corresponding to the image data DATA may be applied to the data lines DL1 to DLm through the auxiliary data lines SDL1 to SDLp in case that a gate signal is applied to each of the first to m-th gate lines GL1 to GLm. Accordingly, the corresponding sub-pixels SP may generate light corresponding to the data signals. Accordingly, an image is displayed on the display panel 110.

The data driver 130 may be located on a side parallel to the gate driver 120. The data driver 130 may be located on the short side of the display panel 110 (for example, at least one of the side adjacent to the left short side or the side adjacent to the right short side). For example, the data driver 130 may be located on the left side or the right side of the display panel 110.

In embodiments, the gate driver 120 and the data driver 130 may include complementary metal-oxide semiconductor (CMOS) circuit elements.

The voltage generator 140 may operate in response to a voltage control signal VCS from the controller 150. The voltage generator 140 is configured to generate a plurality of voltages and provide the generated voltages to components of the display device 100. For example, the voltage generator 140 may be configured to generate the plurality of voltages by receiving an input voltage from an outside of the display device 100, adjusting the received voltage, and regulating the adjusted voltage.

The voltage generator 140 may generate a first power voltage VDD and a second power voltage VSS, and the generated first and second power voltages VDD and VSS may be provided to the sub-pixels SP. The first power voltage VDD may have a relatively high voltage level, and the second power voltage VSS may have a voltage level lower than that of the first power voltage VDD. In other embodiments, the first power voltage VDD or the second power voltage VSS may be provided by an external device of the display device 100.

In addition, the voltage generator 140 may generate various voltages. For example, the voltage generator 140 may generate an initialization voltage applied to the sub-pixels SP. For example, during a sensing operation for sensing electrical characteristics of transistors and/or light-emitting elements of the sub-pixels SP, a reference voltage (e.g., predetermined reference voltage) may be applied to the first to n-th data lines DL1 to DLn, and the voltage generator 140 may generate such a reference voltage.

The controller 150 controls overall operations of the display device 100. The controller 150 receives input image data IMG and a control signal CTRL for controlling display of the input image data IMG from the outside. The controller 150 may provide the gate control signal GCS, the data control signal DCS, and the voltage control signal VCS in response to the control signal CTRL.

The controller 150 may convert the input image data IMG so that the input image data IMG is suitable for the display device 100 or the display panel 110 and output the image data DATA. In embodiments, the controller 150 may output the image data DATA by aligning the input image data IMG so that the input image data IMG is suitable for the sub-pixels SP of a row unit.

Two or more components of the data driver 130, the voltage generator 140, and the controller 150 may be mounted on one integrated circuit. As shown in FIG. 1, the data driver 130, the voltage generator 140, and the controller 150 may be included in a driver integrated circuit DIC. In this case, the data driver 130, the voltage generator 140, and the controller 150 may be functionally divided components in one driver integrated circuit DIC. In other embodiments, at least one of the data driver 130, the voltage generator 140, or the controller 150 may be provided as a component distinguished from the driver integrated circuit DIC.

The display device 100 may include at least one temperature sensor 160. The temperature sensor 160 is configured to sense a temperature around the temperature sensor 160, and to generate temperature data TEP indicating the sensed temperature. In embodiments, the temperature sensor 160 may be located adjacent to the display panel 110 and/or the driver integrated circuit DIC.

The controller 150 may control various operations of the display device 100 in response to the temperature data TEP. In embodiments, the controller 150 may adjust a luminance of the image output from the display panel 110 in response to the temperature data TEP. For example, the controller 150 may control the data signals and the first and second driving voltages VDD and VSS by controlling components such as the data driver 130 and/or the voltage generator 140.

Figure 2:
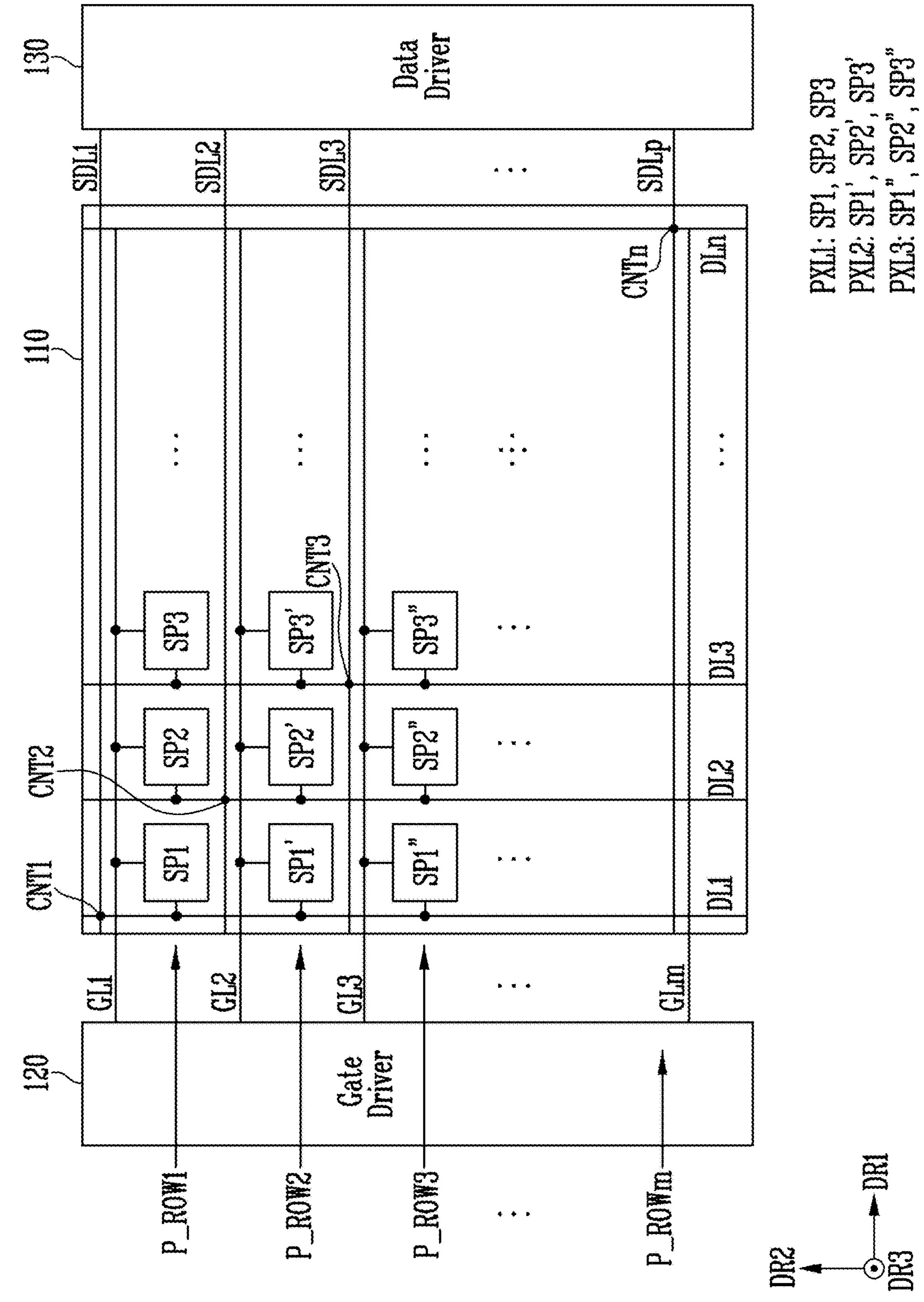
FIG. 2 is a schematic diagram illustrating one or more embodiments of gate lines, auxiliary data lines, and data lines connected to pixel rows and pixel columns included in the display device of FIG. 1.

FIG. 2 is a schematic diagram illustrating one or more embodiments of gate lines, auxiliary data lines, and data lines connected to pixel rows and pixel columns included in the display device of FIG. 1.

Referring to FIG. 2, the display panel 110 (or the display device 100) may include pixel rows P_ROW1 to P_ROW3 respectively including pixels PXL1, PXL2, and PXL3.

The first pixel PXL1 may be located in the first pixel row P_ROW1. A location of the first pixel PXL1 may be repeated in the first direction DR1 in the first pixel row P_ROW1. The second pixel PXL2 may be located in the second pixel row P_ROW2. A location of the second pixel PXL2 may be repeated in the first direction DR1 in the second pixel row P_ROW2. The third pixel PX3 may be located in the third pixel row P_ROW3. A location of the third pixel PXL3 may be repeated in the first direction DR1 in the third pixel row P_ROW3. A location of the first pixel PXL1, the second pixel PXL2, and the third pixel PXL3 may be repeated (e.g., a pattern may be repeated) in a direction opposite to the second direction DR2 from the first pixel row P_ROW1 to an m-th pixel row P_ROWm.

The first pixel PXL1 may include a first sub-pixel SP1, a second sub-pixel SP2, and a third sub-pixel SP3 arranged in the first direction DR1. The second pixel PXL2 may include a first sub-pixel SP1', a second sub-pixel SP2', and a third sub-pixel SP3' arranged in the first direction DR1. The third pixel PXL3 may include a first sub-pixel SP1", a second sub-pixel SP2", and a third sub-pixel SP3" arranged in the first direction DR1.

The gate lines GL1 to GLm may extend along a long side direction (for example, the first direction DR1) of the display panel 110. Each of the gate lines GL1 to GLm may define a row of sub-pixels SP, and each of the gate lines GL1 to GLm may be connected to the sub-pixels SP of a pixel row.

The sub-pixels SP of an i-th (where i is a positive integer) pixel row may be connected (for example, electrically connected) to an i-th gate line. For example, the sub-pixels SP1, SP2, and SP3 of the first pixel PXL1 located in a first pixel row may be connected to the first gate line GL1. The sub-pixels SP1', SP2', and SP3' of the second pixel PXL2 located in a second pixel row may be connected to the second gate line GL2. The sub-pixels SP1", SP2", and SP3" of the third pixel PXL3 located in a third pixel row may be connected to the third gate line GL3.

The data lines DL1 to DLn may extend in a direction crossing the gate lines GL1 to GLm. For example, the data lines DL1 to DLn may extend along the short side direction of the display panel 110 (for example, the second direction DR2). Each of the data lines DL1 to DLn may define a column of the sub-pixels SP, and each of the data lines DL1 to DLn may be connected to the sub-pixels SP of a pixel column. The data lines DL1 to DLn may be electrically connected to the auxiliary data lines SDL1 to SDLp, and may receive data signals from the data driver 130.

The sub-pixels SP of a j-th (where j is a positive integer) pixel column may be connected (for example, electrically connected) to a j-th data line. For example, the first sub-pixels SP1, SP1', and SP1" of the first pixel column may be connected to the first data line DL1. The second sub-pixels SP2, SP2', and SP2" of a second pixel column may be connected to the second data line DL2. The third sub-pixels SP3, SP3', and SP3" of a third pixel row may be connected to the third data line DL3.

The auxiliary data lines SDL1 to SDLp may extend in the same direction as the gate lines GL1 to GLm. For example, the auxiliary data lines SDL1 to SDLp may extend along the long side direction (for example, the first direction DR1) of the display panel 110.

In one or more embodiments, the number of the auxiliary data lines SDL1 to SDLp may correspond to the number of the data lines DL1 to DLn. For example, the auxiliary data lines SDL1 to SDLp may include p auxiliary data lines, the data lines DL1 to DLn may include n data lines, and p may be a positive integer equal to n. For example, the number of the data lines DL1 to DLn may correspond to the number of the columns of the sub-pixels SP, and the number of the auxiliary data lines SDL1 to SDLp may correspond to the number of the data lines DL1 to DLn. However, the disclosure is not limited thereto. For example, the number of the auxiliary data lines SDL1 to SDLp may be greater than the number of the data lines DL1 to DLn. This is described later with reference to FIG. 3.

Each of the data lines DL1 to DLn may be electrically connected to at least one of the auxiliary data lines SDL1 to SDLp. For example, the respective data lines DL1 to DLn may be electrically connected to the respective auxiliary data lines SDL1 to SDLp through a contact hole. For example, the first data line DL1 and the first auxiliary data line SDL1 may be electrically connected to each other through a first contact hole CNT1. The first contact hole CNT1 may electrically connect the first data line DL1 to at least one of the auxiliary data lines SDL1 to SDLp. The second data line DL2 and the second auxiliary data line SDL2 may be electrically connected to each other through a second contact hole CNT2. The second contact hole CNT2 may electrically connect the second data line DL2 to at least one of the auxiliary data lines SDL1 to SDLp. The third data line DL3 and the third auxiliary data line SDL3 may be electrically connected to each other through a third contact hole CNT3. The third contact hole CNT3 may electrically connect the third data line DL3 to at least one of the auxiliary data lines SDL1 to SDLp. As described above, the display device 100 may include first to n-th contact holes CNT1 to CNTn electrically connecting each of the data lines DL1 to DLn to at least one of the auxiliary data lines SDL1 to SDLp.

In FIG. 2, each of the data lines DL1 to DLn is shown as being electrically connected to each of the auxiliary data lines SDL1 to SDLp through one contact hole, but the disclosure is not limited thereto. For example, at least one of the data lines DL1 to DLn may be electrically connected to respective auxiliary data lines SDL1 to SDLp through at least two or more contact holes. This is described with reference to FIG. 3.

Figure 3:
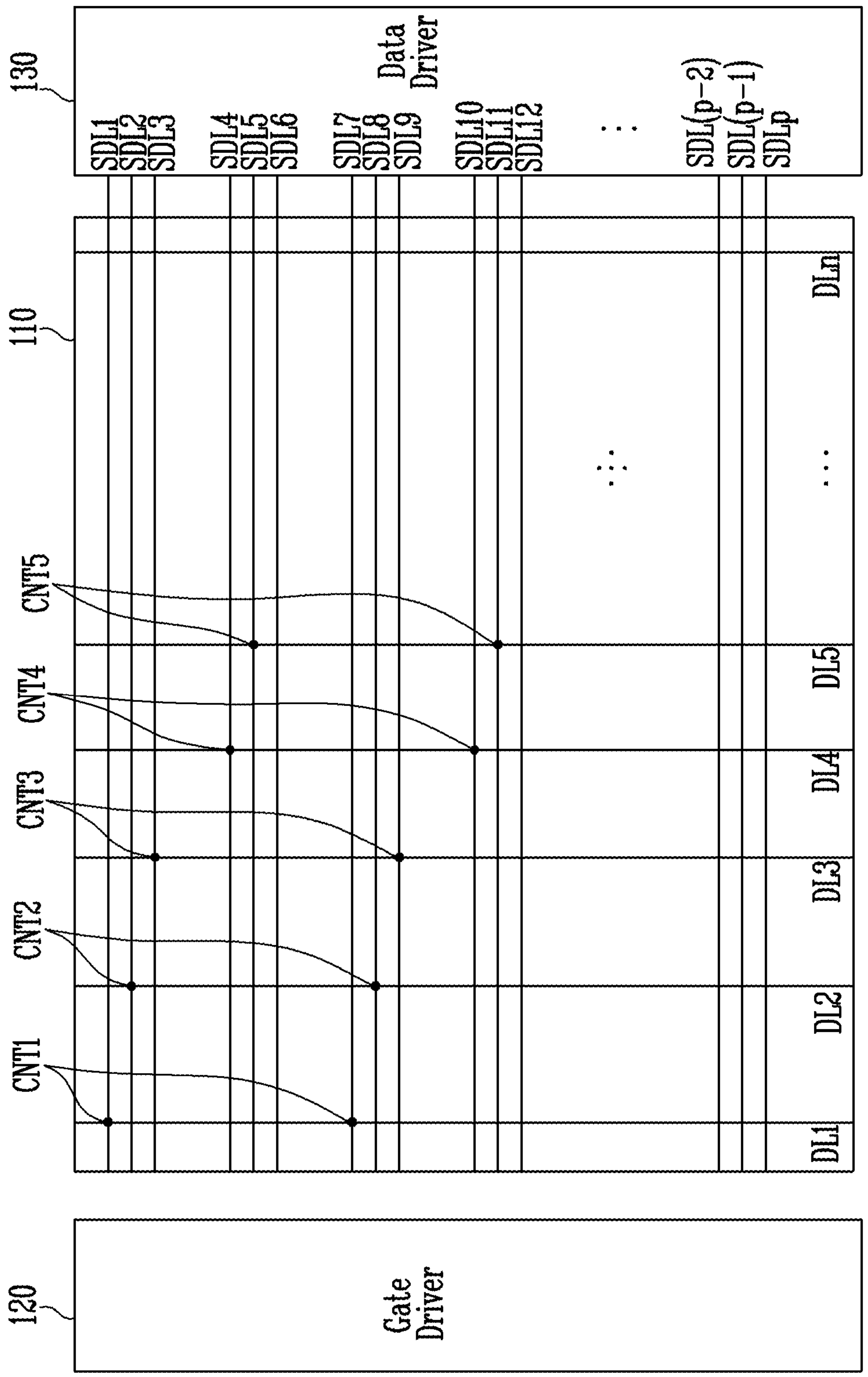
FIG. 3 is a schematic diagram illustrating one or more other embodiments of the auxiliary data lines and the data lines connected to the pixel rows and the pixel columns included in the display device of FIG. 1.

FIG. 3 is a schematic diagram illustrating one or more other embodiments of the auxiliary data lines and the data lines connected to the pixel rows and the pixel columns included in the display device of FIG. 1. Compared to FIG. 2, in FIG. 3, the gate lines GL1 to GLm and the sub-pixels SP are omitted to clearly show a location relationship of the auxiliary data lines SDL1 to SDLp and the data lines DL1 to DLn.

Referring to FIG. 3, each of the data lines DL1 to DLn may be electrically connected to the auxiliary data lines SDL1 to SDLp through a plurality of contact holes. For example, the first data line DL1 may be electrically connected to at least some of the auxiliary data lines SDL1 to SDLp through first contact holes CNT1. The second data line DL2 may be electrically connected to at least some of the auxiliary data lines SDL1 to SDLp through second contact holes CNT2. The third data line DL3 may be electrically connected to at least some of the auxiliary data lines SDL1 to SDLp through third contact holes CNT3. The fourth data line DL4 may be electrically connected to at least some of the auxiliary data lines SDL1 to SDLp through fourth contact holes CNT4. The fifth data line DL5 may be electrically connected to at least some of the auxiliary data lines SDL1 to SDLp through fifth contact holes CNT5.

In one or more embodiments, the number of the auxiliary data lines SDL1 to SDLp may correspond to a positive integer multiple of the number of the data lines DL1 to DLn. For example, the auxiliary data lines SDL1 to SDLp may include p auxiliary data lines, the data lines DL1 to DLn may include n data lines, and p may be a positive integer multiple of n. For example, the p may be at least one of 2n, 3n, 4n, 5n, 6n, 7n, 8n, 9n, or 10n. For example, the number of the data lines DL1 to DLn may correspond to the number of the columns of the sub-pixels SP, and the number of the auxiliary data lines SDL1 to SDLp may be a positive integer multiple of the number of the data lines DL1 to DLn.

The auxiliary data lines electrically connected to the first contact holes CNT1 may apply a same data signal to the first data line DL1. For example, in FIG. 3, the first and seventh auxiliary data lines SDL1 and SDL7 electrically connected to the first contact holes CNT1 may apply the same data signal to the first data line DL1.

The auxiliary data lines electrically connected to the second contact holes CNT2 may apply a same data signal to the second data line DL2. For example, in FIG. 3, the second and eighth auxiliary data lines SDL2 and SDL8 electrically connected to the second contact holes CNT2 may apply the same data signal to the second data line DL2.

The auxiliary data lines electrically connected to the third contact holes CNT3 may apply a same data signal to the third data line DL3. For example, in FIG. 3, the third and ninth auxiliary data lines SDL3 and SDL9 electrically connected to the third contact holes CNT3 may apply the same data signal to the third data line DL3.

The auxiliary data lines electrically connected to the fourth contact holes CNT4 may apply a same data signal to the fourth data line DL4. For example, in FIG. 3, the fourth and tenth auxiliary data lines SDL4 and SDL10 electrically connected to the fourth contact holes CNT4 may apply the same data signal to the fourth data line DL4.

The auxiliary data lines electrically connected to the fifth contact holes CNT5 may apply a same data signal to the fifth data line DL5. For example, in FIG. 3, the fifth and eleventh auxiliary data lines SDL5 and SDL11 electrically connected to the fifth contact holes CNT5 may apply the same data signal to the fifth data line DL5.

In FIG. 3, as one or more embodiments, one or more embodiments in which each of the data lines DL1 to DLn is electrically connected to at least some of the auxiliary data lines SDL1 to SDLp through two contact holes, but the disclosure is not limited thereto. In one or more embodiments, each of the data lines DL1 to DLn may include at least two or more contact holes.

In addition, a position of the auxiliary data lines SDL1 to SDLp electrically connected to each of the data lines DL1 to DLn is not limited to the one or more embodiments corresponding to FIG. 3. For example, in FIG. 3, the first data line DL1 and the first and seventh auxiliary data lines SDL1 and SDL7 are shown as being electrically connected, but according to one or more embodiments, the first data line DL1 and the first and ninth auxiliary data lines SDL1 and SDL9 may be electrically connected.

Because at least a portion of the data lines DL1 to DLn is electrically connected to, or through, two or more contact holes, the data signal may be applied through at least two or more contact holes, and a load deviation of the data signal (or a data signal delay deviation) in the second direction DR2 may be reduced.

In the display device 100 according to the disclosure, the gate driver 120 and the data driver 130 may be located on a respective short side of the display panel 110, as shown in FIGS. 2 and 3. Accordingly, the display panel 110, which is able to be used such that a user does not feel dizzy, may be provided in case that the display device 100 is applied to a display that provides virtual reality and augmented reality. For example, the display device 100 according to the disclosure may be provided as a display device that provides virtual reality or augmented reality, and in this case, the user may be provided with virtual reality or augmented reality without feeling dizzy.

For the user not to feel dizzy in case that the display device 100 is applied to a display that provides virtual reality and augmented reality, a size of the display panel may be appropriately increased. In case that the gate driver 120 and the data driver 130 are respectively positioned on the long side and the short side of the display panel, manufacturing the display panel in one process unit using existing equipment may be difficult if the size of the display panel is increased. For example, the gate driver 120 and the gate lines GL1 to GLn may be formed in one process unit using one mask, and the data driver 130 and the data lines DL1 to DLn may be formed in another process unit using another mask.

Compared to this, according to the disclosure, the gate driver 120 and the data driver 130 may be positioned on a respective short side of the display panel 110, and thus the display panel 110 may be manufactured in one process unit while increasing the size of the display panel 110. Accordingly, a process time and a process cost may be reduced, and the display device 100 may provide virtual reality and augmented reality without providing dizziness to the user.

Figure 4:
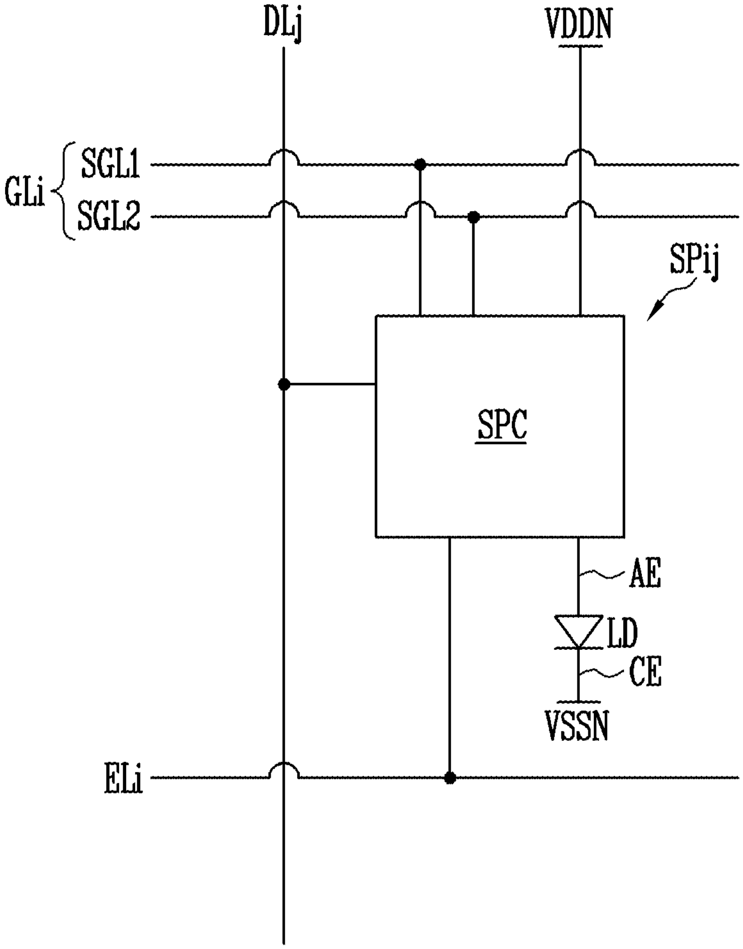
FIG. 4 is a schematic block diagram illustrating one or more embodiments of one of sub-pixels of FIG. 1.

FIG. 4 is a schematic block diagram illustrating one or more embodiments of one of the sub-pixels of FIG. 1. In FIG. 4, among the sub-pixels SP of FIG. 1, a sub-pixel SPij arranged in an i-th row (i is an integer greater than or equal to 1 and less than or equal to m) and a j-th column (j is an integer greater than or equal to 1 and less than or equal to n) is shown as an example.

Referring to FIG. 4, the sub-pixel SPij may include a sub-pixel circuit SP C and a light-emitting element LD.

The light-emitting element LD is connected between a first power voltage node VDDN and a second power voltage node VSSN. At this time, the first power voltage node VDDN is a node that transmits the first power voltage VDD of FIG. 1, and the second power voltage node VSSN is a node that transmits the second power voltage VSS of FIG. 1.

An anode electrode AE of the light-emitting element LD may be connected to the first power voltage node VDDN through the sub-pixel circuit SPC, and a cathode electrode CE of the light-emitting element LD may be connected to the second power voltage node VSSN. For example, the anode electrode AE of the light-emitting element LD may be connected to the first power voltage node VDDN through one or more transistors included in the sub-pixel circuit SPC.

The sub-pixel circuit SPC may be connected to an i-th gate line GLi among the first to m-th gate lines GL1 to GLm of FIG. 1, an i-th emission control line ELi among the first to m-th emission control lines EL1 to ELm of FIG. 1, and a j-th data line DLj among the first to n-th data lines DL1 to DLn of FIG. 1. The sub-pixel circuit SPC is configured to control the light-emitting element LD according to signals received through these signal lines.

The sub-pixel circuit SPC may operate in response to a gate signal received through the i-th gate line GLi. The i-th gate line GLi may include one or more sub-gate lines. In embodiments, as shown in FIG. 4, the i-th gate line GLi may include first and second sub-gate lines SGL1 and SGL2. The sub-pixel circuit SPC may operate in response to gate signals received through the first and second sub-gate lines SGL1 and SGL2. As described above, the sub-pixel circuit SPC may operate in response to gate signals received through the corresponding sub-gate lines in case that the i-th gate line GLi includes two or more sub-gate lines.

The sub-pixel circuit SPC may operate in response to an emission control signal received through the i-th emission control line ELi. In embodiments, the i-th emission control line ELi may include one or more sub-emission control lines. The sub-pixel circuit SPC may operate in response to emission control signals received through the corresponding sub-emission control lines in case that the i-th emission control line E Li includes two or more sub-emission control lines.

The sub-pixel circuit SPC may receive a data signal through the j-th data line DLj. The sub-pixel circuit SPC may store a voltage corresponding to the data signal in response to at least one of the gate signals received through the first and/or second sub-gate lines SGL1 and/or SGL2. The sub-pixel circuit SPC may control a current flowing from the first power voltage node VDDN to the second power voltage node VSSN through the light-emitting element LD according to the stored voltage, in response to the emission control signal received through the i-th emission control line ELi. Accordingly, the light-emitting element LD may generate light of a luminance corresponding to the data signal.

Figure 5:
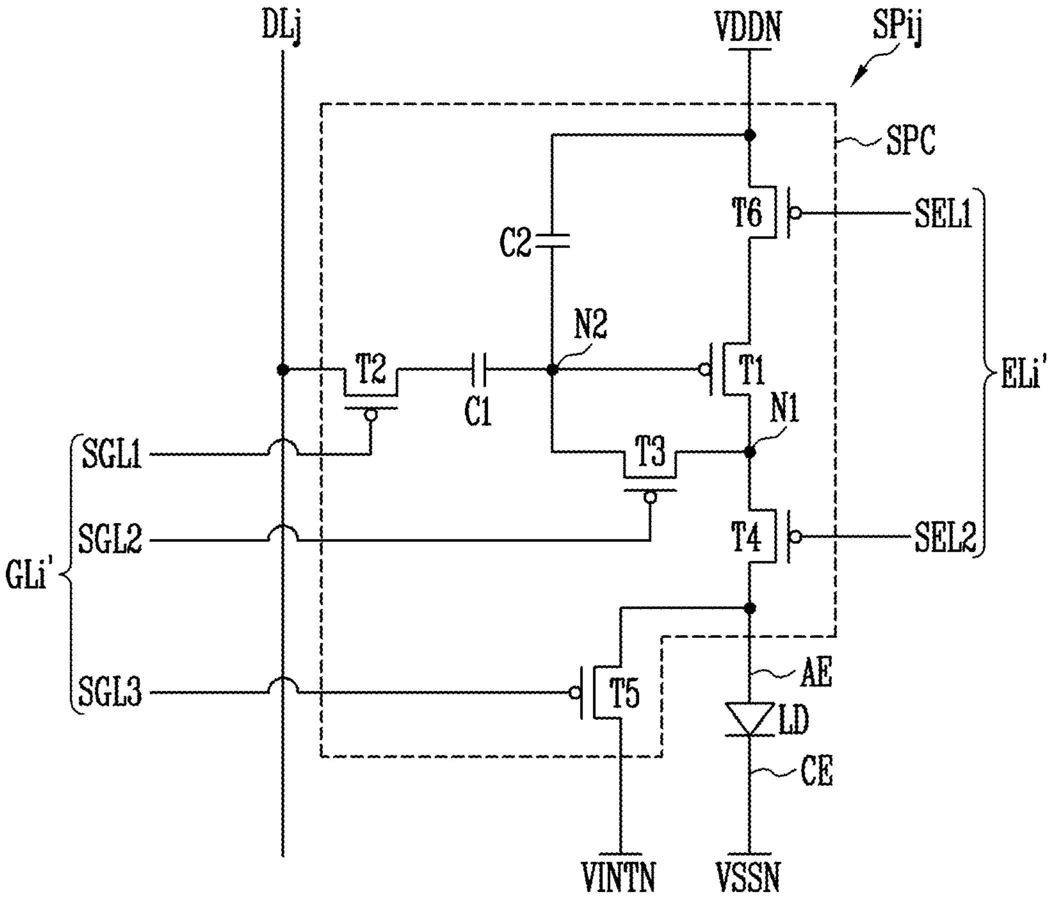
FIG. 5 is a schematic diagram illustrating one or more embodiments of the sub-pixel equivalent circuit of FIG. 4.

FIG. 5 is a schematic diagram illustrating one or more embodiments of the sub-pixel equivalent circuit of FIG. 4.

Referring to FIG. 5, the sub-pixel SPij may include the sub-pixel circuit SP C and the light-emitting element LD.

The sub-pixel circuit SPC may be connected to an i-th gate line GLi', an i-th emission control line ELi', and the j-th data line DLj. Compared to the i-th gate line GLi of FIG. 4, the i-th gate line GLi' may further include a third sub-gate line SGL3. Compared to the i-th emission control line ELi of FIG. 4, the i-th emission control line ELi' may include a first sub-emission control line SEL1 and a second sub-emission control line SEL2.

The sub-pixel circuit SPC may include first to sixth transistors T1 to T6 and first and second capacitors C1 and C2.

The first transistor T1 is connected between the first power voltage node VDDN and a first node N1. A gate of the first transistor T1 may be connected to a second node N2, and thus the first transistor T1 may be turned on according to a voltage level of the second node N2. The first transistor T1 may be referred to as a driving transistor.

The second transistor T2 is connected between the j-th data line DLj and the second node N2. A gate of the second transistor T2 may be connected to the first sub-gate line SGL1, and thus the second transistor T2 may be turned on in response to the gate signal of the first sub-gate line SGL1. The second transistor T2 may be referred to as a switching transistor.

The third transistor T3 is connected between the first node N1 and the second node N2. A gate of the third transistor T3 may be connected to the second sub-gate line SGL2, and thus the third transistor T3 may be turned on in response to the gate signal of the second sub-gate line SGL2.

The fourth transistor T4 is connected between the first node N1 and the anode electrode AE of the light-emitting element LD. A gate of the fourth transistor T4 may be connected to the second sub-emission control line SEL2, and thus the fourth transistor T4 may be turned on in response to the emission control signal of the second sub-emission control line SEL2.

The fifth transistor T5 is connected between the anode electrode AE of the light-emitting element LD and an initialization voltage node VINTN. The initialization voltage node VINTN is configured to transmit an initialization voltage. In embodiments, the initialization voltage may be provided by the voltage generator 140 of FIG. 1. In other embodiments, the initialization voltage may be provided by an external device of the display device 100. A gate of the fifth transistor T5 may be connected to the third sub-gate line SGL3, and thus the fifth transistor T5 may be turned on in response to the gate signal of the third sub-gate line SGL3.

The sixth transistor T6 is connected between the first power voltage node VDDN and the first transistor T1. A gate of the sixth transistor T6 may be connected to the first sub-emission control line SEL1, and thus the sixth transistor T6 may be turned on in response to the emission control signal of the first sub-emission control line SEL1.

The first capacitor C1 is connected between the second transistor T2 and the second node N2. The second capacitor C2 is connected between the first power voltage node VDDN and the second node N2.

As described above, the sub-pixel circuit SPC may include the first to sixth transistors T1 to T6 and the first and second capacitors C1 and C2. However, embodiments are not limited thereto. The sub-pixel circuit SPC may be implemented as one of various types of circuits including a plurality of transistors and one or more capacitors. For example, the sub-pixel circuit SPC may include two transistors and one capacitor. According to embodiments of the sub-pixel circuit SPC, the number of sub-gate lines included in the i-th gate line GLi' and the number of sub-emission control lines included in the i-th emission control line ELi' may vary.

The first to sixth transistors T1 to T6 may be P-type transistors. Each of the first to sixth transistors T1 to T6 may be a metal oxide silicon field effect transistor (MOSFET). However, embodiments are not limited thereto. For example, at least one of the first to sixth transistors T1 to T6 may be replaced with an N-type transistor.

In embodiments, the first to sixth transistors T1 to T6 may include an amorphous silicon semiconductor, a monocrystalline silicon, a polycrystalline silicon semiconductor, an oxide semiconductor, and the like.

The light-emitting element LD may include the anode electrode AE, the cathode electrode CE, and a light-emitting layer. The light-emitting layer may be located between the anode electrode AE and the cathode electrode CE. After the data signal transmitted through the j data line DLj is reflected in a voltage of the second node N2, the fourth and sixth transistors T4 and T6 may be turned on in case that the emission control signals of the first and second sub-emission control lines SEL1 and SEL2 are enabled to a low level. In addition, the first transistor T1 may be turned on according to the voltage of the second node N2, and thus a current may flow from the first power voltage node VDDN to the second power voltage node VSSN. The light-emitting element LD may emit light according to an amount of the flowing current.

Figure 6:
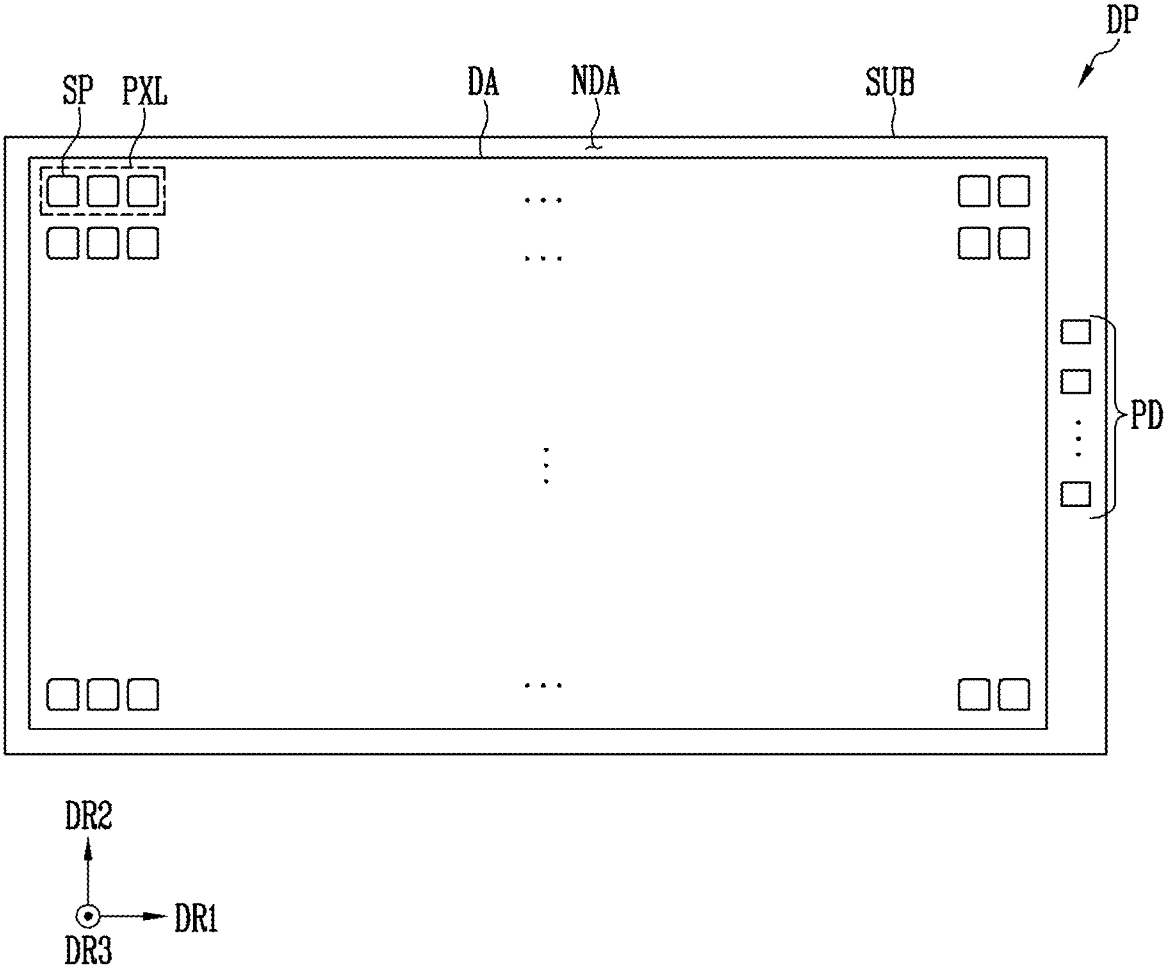
FIG. 6 is a plan view illustrating one or more embodiments of a display panel of FIG. 1.

FIG. 6 is a plan view illustrating one or more embodiments of the display panel of FIG. 1.

Referring to FIG. 6, one or more embodiments DP of the display panel 110 of FIG. 1 may include a display area DA and a non-display area NDA. The display panel DP displays an image through the display area DA. The non-display area NDA is located around the display area DA.

The display panel DP may include a substrate SUB, the sub-pixels SP, and pads PD. The display panel DP may be positioned very close to user's eyes in case that the display panel DP is used as a display screen of a head-mounted display (HMD), a virtual reality (VR) device, a mixed reality (MR) device, an augmented reality (AR) device, or the like. In this case, sub-pixels SP of a relatively high integration degree are required. To increase an integration degree of the sub-pixels SP, the substrate SUB may be provided as a silicon substrate. The sub-pixels SP and/or the display panel DP may be formed on the substrate SUB, which is the silicon substrate. The display device 100 (refer to FIG. 1) including the display panel DP formed on the substrate SUB, which is the silicon substrate, may be referred to as an OLED on silicon (OLEDoS) display device.

The sub-pixels SP are located in the display area DA on the substrate SUB. The sub-pixels SP may be arranged in a matrix shape along a first direction DR1 and a second direction DR2 crossing the first direction DR1. However, embodiments are not limited thereto. For example, the sub-pixels SP may be arranged in a zigzag shape along the first direction DR1 and the second direction DR2. For example, the sub-pixels SP may be arranged in a PEN- TILE™ shape (PENTILE™ being a registered trademark of Samsung Display Co., Ltd., Republic of Korea). The first direction DR1 may be a row direction, and the second direction DR2 may be a column direction.

Two or more sub-pixels among the plurality of sub-pixels SP may configure one pixel PXL.

A component for controlling the sub-pixels SP may be located in the non-display area NDA on the substrate SUB. For example, lines connected to the sub-pixels SP, such as the first to m-th gate lines GL1 to GLm, the first to n-th data lines DL1 to DLn, and the first to p-th auxiliary data lines SDL1 to SDLp of FIG. 1, may be located in the non-display area NDA.

At least one of the gate driver 120, the data driver 130, the voltage generator 140, the controller 150, or the temperature sensor 160 of FIG. 1 may be integrated in the non-display area NDA of the display panel DP. In embodiments, the gate driver 120 of FIG. 1 may be mounted on the display panel DP and may be located in the non-display area NDA. In other embodiments, the gate driver 120 may be implemented as an integrated circuit separated from the display panel DP. In embodiments, the temperature sensor 160 may be located in the non-display area NDA to sense a temperature of the display panel DP.

The pads PD are located in the non-display area NDA on the substrate SUB. The pads PD may be electrically connected to the sub-pixels SP through lines. For example, the pads PD may be connected to the sub-pixels SP through the first to p-th auxiliary data lines SDL1 to SDLp and the first to n-th data lines DL1 to DLn.

The pads PD may interface the display panel DP to other components of the display device 100 (refer to FIG. 1). In embodiments, voltages and signals suitable for an operation of components included in the display panel DP may be provided from the driver integrated circuit DIC of FIG. 1 through the pads PD. For example, the first to n-th data lines DL1 to DLn may be connected to the driver integrated circuit DIC through the pads PD. For example, the first and second power voltages VDD and VSS may be received from the driver integrated circuit DIC through the pads PD. For example, the gate control signal GCS may be transmitted from the driver integrated circuit DIC to the gate driver 120 through the pads PD in case that the gate driver 120 is mounted on the display panel DP.

In embodiments, a circuit board may be electrically connected to the pads PD using a conductive adhesive member, such as an anisotropic conductive film. At this time, the circuit board may be a flexible circuit board (FPCB) or a flexible film having a flexible material. The driver integrated circuit DIC may be mounted on the circuit board to be electrically connected to the pads PD.

In embodiments, the display area DA may have various shapes. The display area DA may have a closed loop shape including straight and/or curved sides. For example, the display area DA may have shapes, such as a polygon, a circle, a semicircle, and an ellipse.

In embodiments, the display panel DP may have a flat display surface. In other embodiments, the display panel DP may have a display surface that is at least partially round. In embodiments, the display panel DP may be bendable, foldable, or rollable. In these cases, the display panel DP and/or the substrate SUB may include materials having a flexible property.

Figure 7:
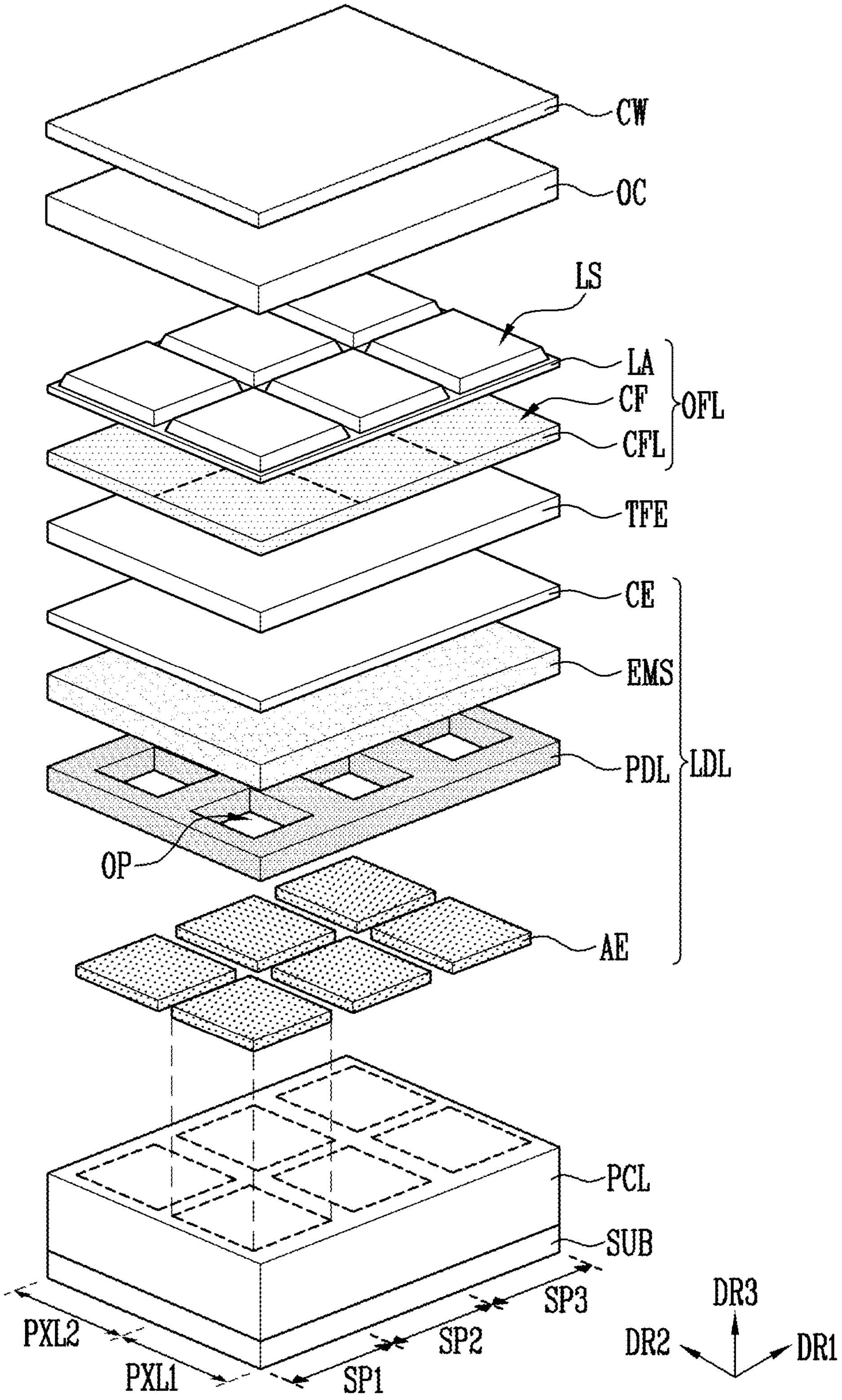
FIG. 7 is an exploded perspective view illustrating a portion of the display panel of FIG. 6.
Figure 10:
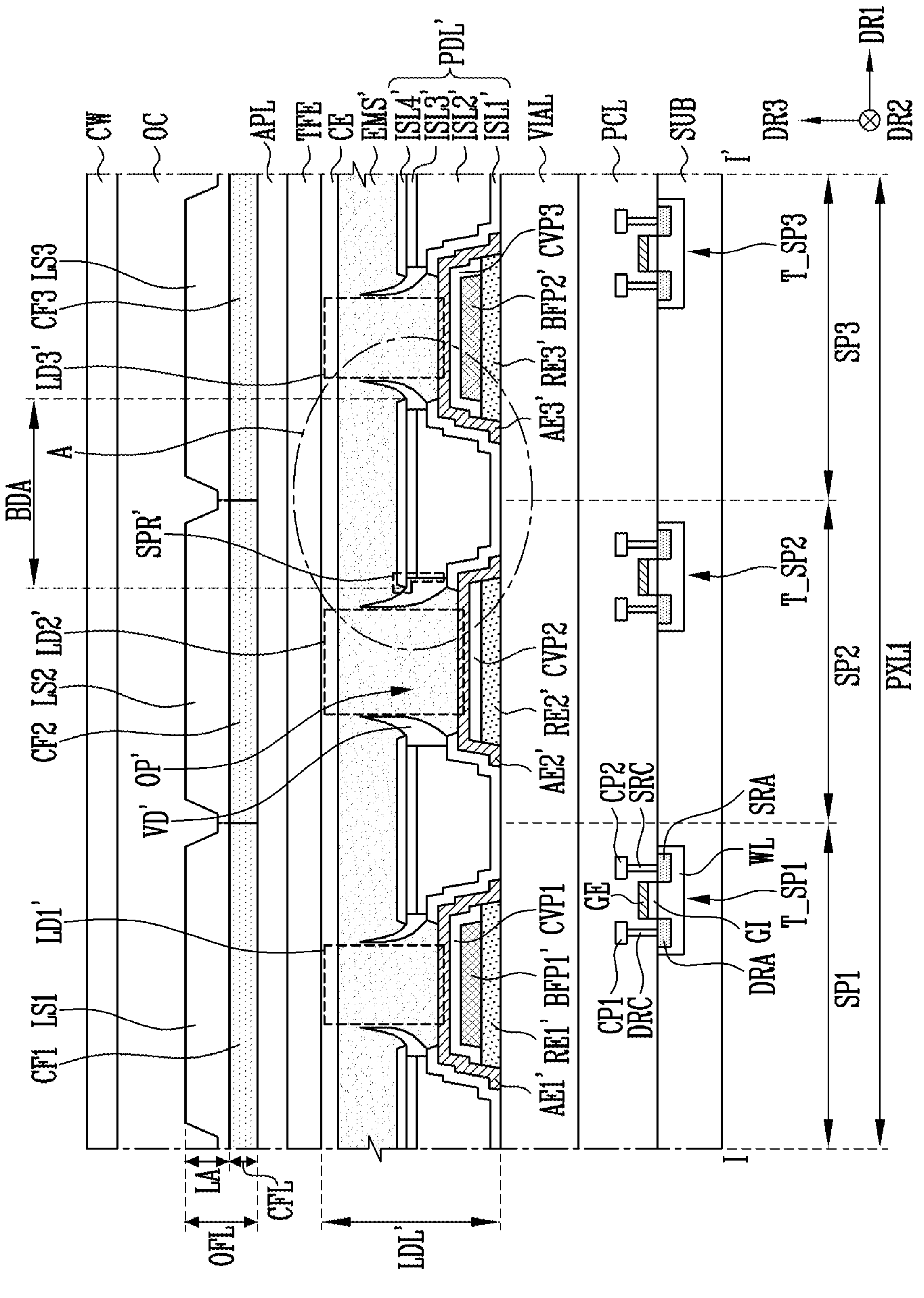
FIG. 10 is a cross-sectional view taken along the line I-I' of FIG. 8 according to one or more other embodiments of the disclosure.

FIG. 7 is an exploded perspective view illustrating a portion of the display panel of FIG. 6. In FIG. 10, for clarify and concise description, a portion of the display panel DP corresponding to two pixels PXL1 and PXL2 among the pixels PXL of FIG. 6 is schematically shown. A portion of the display panel DP corresponding to remaining pixels may be similarly configured.

Referring to FIGS. 6 and 7, each of the first and second pixels PXL1 and PXL2 may include first to third sub-pixels SP1, SP2, and SP3. However, embodiments are not limited thereto. For example, each of the first and second pixels PXL1 and PXL2 may include four sub-pixels or two sub-pixels.

In FIG. 7, the first to third sub-pixels SP1, SP2, and SP3 have quadrangle shapes in a third direction DR3 crossing the first and second directions DR1 and DR2, and have sizes equal to each other. However, embodiments are not limited thereto. The first to third sub-pixels SP1, SP2, and SP3 may be modified to have various shapes.

The display panel DP may include a substrate SUB, a pixel circuit layer PCL, a light-emitting element layer LDL, an encapsulation layer TFE, an optical function layer OFL, an overcoat layer OC, and a cover window CW.

In embodiments, the substrate SUB may include a silicon wafer substrate formed using a semiconductor process. The substrate SUB may include a semiconductor material suitable for forming circuit elements. For example, the semiconductor material may include silicon, germanium, and/or silicon-germanium. The substrate SUB may be provided from a bulk wafer, an epitaxial layer, a silicon on insulator (SOI) layer, a semiconductor on insulator (SeOI) layer, or the like. In other embodiments, the substrate SUB may include a glass substrate. In still other embodiments, the substrate SUB may include a polyimide (PI) substrate.

The pixel circuit layer PCL is located on the substrate SUB (as used herein, "located on" may mean "above"). The substrate SUB and/or the pixel circuit layer PCL may include insulating layers and conductive patterns located between the insulating layers. The conductive patterns of the pixel circuit layer PCL may function as at least a portion of circuit elements, lines, and the like. The conductive patterns may include copper, but embodiments are not limited thereto.

The circuit elements may include the sub-pixel circuit SPC (refer to FIG. 4) for each of the first to third sub-pixels SP1, SP2, and SP3. The sub-pixel circuit SP C may include transistors and one or more capacitors. Each transistor may include a semiconductor portion including a source area, a drain area, and a channel area, and a gate electrode overlapping the semiconductor portion. In embodiments, the semiconductor portion may be included in the substrate SUB, and the gate electrode may be included in the pixel circuit layer PCL as a conductive pattern of the pixel circuit layer PCL, in case that the substrate SUB is provided as a silicon substrate. In embodiments, the semiconductor portion and the gate electrode may be included in the pixel circuit layer PCL in case that the substrate SUB is provided as a glass substrate or a PI substrate. Each capacitor may include electrodes spaced apart from each other. For example, each capacitor may include electrodes spaced apart from each other on a plane defined by the first and second directions DR1 and DR2. For example, each capacitor may include electrodes spaced apart from each other in the third direction DR3 with an insulating layer interposed between the electrodes.

The lines of the pixel circuit layer PCL may include signal lines connected to each of the first to third sub-pixels SP1, SP2, and SP3, for example, a gate line, an emission control line, a data line, and the like. The lines may further include a line connected to the first power voltage node VDDN of FIG. 4. In addition, the lines may further include a line connected to the second power voltage node VSSN of FIG. 4.

The light-emitting element layer LDL may include the anode electrodes AE, a pixel-defining layer PDL, a light-emitting structure EMS, and the cathode electrode CE.

The anode electrodes AE may be located on the pixel circuit layer PCL. The anode electrodes AE may contact the circuit elements of the pixel circuit layer PCL. The anode electrodes AE may include an opaque conductive material capable of reflecting light, but embodiments are not limited thereto.

The pixel-defining layer PDL is located on the anode electrodes AE. The pixel-defining layer PDL may include an opening OP exposing a portion of each of the anode electrodes AE. According to the opening OP of the pixel-defining layer PDL, emission areas respectively corresponding to the first to third sub-pixels SP1 to SP3 may be defined. Alternatively, it may be understood that the emission areas corresponding to the first to third sub-pixels SP1 to SP3 are defined according to the anode electrodes AE. In an area adjacent to a boundary between neighboring sub-pixels, the pixel-defining layer PDL may include a separator that causes formation of a discontinuous portion (discontinuity) in the light-emitting structure EMS. In this case, it may be understood that the emission areas respectively corresponding to the first to third sub-pixels SP1 to SP3 are defined according to the separators of the pixel-defining layer PDL.

In embodiments, the pixel-defining layer PDL may include an inorganic material. In this case, the pixel-defining layer PDL may include a plurality of stacked inorganic layers. For example, the pixel-defining layer PDL may include silicon oxide (SiOx) and silicon nitride (SiNx). In other embodiments, the pixel-defining layer PDL may include an organic material. However, a material of the pixel-defining layer PDL is not limited thereto.

The light-emitting structure EMS may be located on the anode electrodes AE exposed by the opening OP of the pixel-defining layer PDL. The light-emitting structure EMS may include a light-emitting layer configured to generate light, an electron transport layer configured to transport an electron, a hole transport layer configured to transport a hole, and the like.

In embodiments, the light-emitting structure EMS may fill the opening OP of the pixel-defining layer PDL, and may be entirely located on the pixel-defining layer PDL. In other words, the light-emitting structure EMS may extend across the first to third sub-pixels SP1 to SP3. In this case, at least a portion of layers in the light-emitting structure EMS may be disconnected or bent at boundaries between the first to third sub-pixels SP1 to SP3. However, embodiments are not limited thereto. For example, portions of the light-emitting structure EMS corresponding to the first to third sub-pixels SP1 to SP3 may be separated from each other, and each of the portions may be located in the opening OP of the pixel-defining layer PDL.

The cathode electrode CE may be located on the light-emitting structure EMS. The cathode electrode CE may extend across the first to third sub-pixels SP1 to SP3. As described above, the cathode electrode CE may be provided as a common electrode for the first to third sub-pixels SP1 to SP3.

The cathode electrode CE may be a thin metal layer having a thickness sufficient to transmit light emitted from the light-emitting structure EMS. The cathode electrode CE may include a metal material or a transparent conductive material to have a relatively thin thickness. In embodiments, the cathode electrode CE may include at least one of various transparent conductive materials including indium tin oxide, indium zinc oxide, indium tin zinc oxide, aluminum zinc oxide, gallium zinc oxide, zinc tin oxide, or gallium tin oxide. In other embodiments, the cathode electrode CE may include at least one of silver (Ag), magnesium (Mg), or a mixture thereof. However, a material of the cathode electrode CE is not limited thereto.

It may be understood that any of the anode electrodes AE, a portion of the light-emitting structure EMS overlapping it, and a portion of the cathode electrode CE overlapping it configure one light-emitting element LD (refer to FIG. 2). In other words, each of the light-emitting elements of the first to third sub-pixels SP1 to SP3 may include one anode electrode, a portion of the light-emitting structure EMS overlapping it, and a portion of the cathode electrode CE overlapping it. In each of the first to third sub-pixels SP1 to SP3, holes injected from the anode electrode AE and electrons injected from the cathode electrode CE may be transported into the light-emitting layer of the light-emitting structure EMS to form excitons, and light may be generated in case that the excitons transits from an excited state to a ground state. A luminance of light may be determined according to an amount of a current flowing through the light-emitting layer. According to a configuration of the light-emitting layer, a wavelength range of the generated light may be determined.

The encapsulation layer TFE is located on the cathode electrode CE. The encapsulation layer TFE may cover the light-emitting element layer LDL and/or the pixel circuit layer PCL. The encapsulation layer TFE may be configured to reduce or prevent oxygen, moisture, and/or the like from permeating to the light-emitting element layer LDL. In embodiments, the encapsulation layer TFE may include a structure in which one or more inorganic layers and one or more organic layers are alternately stacked. For example, the inorganic layer may include silicon nitride, silicon oxide, silicon oxynitride (SiOxNy), or the like. For example, the organic layer may include an organic insulating material, such as acrylic resin, epoxy resin, phenol resin, polyamide resin, polyimide resin, unsaturated polyester resin, polyphenylenether resin, polyphenylenesulfide resin, or benzocyclobutene (BCB). However, materials of the organic layer and the inorganic layer of the encapsulation layer TFE are not limited thereto.

To improve an encapsulation efficiency of the encapsulation layer TFE, the encapsulation layer TFE may further include a thin film including aluminum oxide (AlOx). The thin film including the aluminum oxide may be positioned on an upper surface of the encapsulation layer TFE facing the optical functional layer OFL and/or a lower surface of the encapsulating layer TFE facing the light-emitting element layer LDL.

The thin film including the aluminum oxide may be formed through atomic layer deposition (ALD) method. However, embodiments are not limited thereto. The encapsulation layer TFE may further include a thin film including at least one of various materials suitable for improving the encapsulation efficiency.

The optical functional layer OFL is located on the encapsulation layer TFE. The optical functional layer OFL may include a color filter layer CFL and a lens array LA.

The color filter layer CFL is located between the encapsulation layer TFE and the lens array LA. The color filter layer CFL is configured to filter the light emitted from the light-emitting structure EMS and selectively output light of a wavelength range or a color corresponding to each sub-pixel. The color filter layer CFL may include color filters CF respectively corresponding to the first to third sub-pixels SP1 to SP3, and each of the color filters CF may pass light of a wavelength range corresponding to the corresponding sub-pixel. For example, the color filter corresponding to the first sub-pixel SP1 may pass red color light, the color filter corresponding to the second sub-pixel SP2 may pass green color light, and the color filter corresponding to the third sub-pixel SP3 may pass blue color light. According to the light emitted from the light-emitting structure EMS of each sub-pixel, at least a portion of the color filters CF may be omitted.

The lens array LA is located on the color filter layer CFL. The lens array LA may include lenses LS corresponding to the first to third sub-pixels SP1 to SP3, respectively. Each of the lenses LS may improve light emission efficiency by outputting light emitted from the light-emitting structure EMS to an intended path. The lens array LA may have a relatively high refractive index. For example, the lens array LA may have a refractive index that is higher than that of the overcoat layer OC. In embodiments, the lenses LS may include an organic material. In embodiments, the lenses LS may include an acrylic material. However, a material of the lenses LS is not limited thereto.

In embodiments, compared to the opening OP of the pixel-defining layer PDL, at least a portion of the color filters CF of the color filter layer CFL and at least a portion of the lenses LS of the lens array LA may be shifted in a direction parallel to the plane defined by the first and second directions DR1 and DR2. For example, in a central area of the display area DA, a center of the color filter and a center of the lens may be aligned with or overlap with a center of the opening OP of the corresponding pixel-defining layer PDL in the third direction DR3. For example, in the central area of the display area DA, the opening OP of the pixel-defining layer PDL may completely overlap the corresponding color filter of the color filter layer CFL and the corresponding lens of the lens array LA. In an area adjacent to the non-display area NDA in the display area DA, the center of the color filter and the center of the lens may be shifted in a plane direction from the center of the opening OP of the corresponding pixel-defining layer PDL in the third direction DR3. For example, in the area adjacent to the non-display area NDA in the display area DA, the opening OP of the pixel-defining layer PDL may be partially overlap of the corresponding color filter of the color filter layer CFL and the corresponding lens of the lens array LA. Accordingly, at a center of the display area DA, the light emitted from the light-emitting structure EMS may be efficiently output in a normal direction of a display surface. At an outskirt of the display area DA, the light emitted from the light-emitting structure EMS may be efficiently output in a direction inclined by an angle (e.g., predetermined angle) with respect to the normal direction of the display surface.

The overcoat layer OC may be located on the lens array LA. The overcoat layer OC may cover the optical functional layer OFL, the encapsulation layer TFE, the light-emitting structure EMS, and/or the pixel circuit layer PCL. The overcoat layer OC may include various materials suitable for protecting layers thereunder from a foreign substance, such as dust or moisture. For example, the overcoat layer OC may include at least one of an inorganic insulating layer or an organic insulating layer. For example, the overcoat layer OC may include epoxy, but embodiments are not limited thereto. The overcoat layer OC may have a refractive index lower than that of the lens array LA.

The cover window CW may be located on the overcoat layer OC. The cover window CW is configured to protect layers that are located under the cover window CW. The cover window CW may have a refractive index higher than a refractive index of the overcoat layer OC. The cover window CW may include glass, but embodiments are not limited thereto. For example, the cover window CW may be an encapsulation glass configured to protect components located under the cover window CW. In other embodiments, the cover window CW may be omitted.

Figure 8:
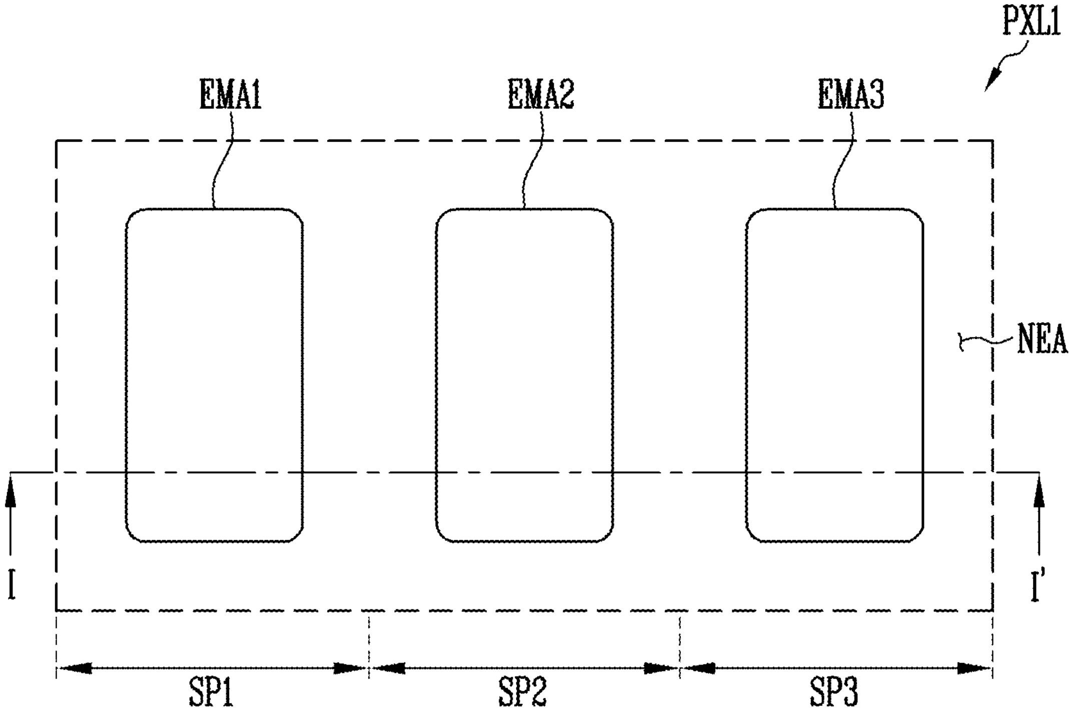
FIG. 8 is a plan view illustrating one or more embodiments of one of pixels of FIG. 7.

FIG. 8 is a plan view illustrating one or more embodiments of one of the pixels of FIG. 7. In FIG. 8, for clarify and concise description, the first pixel PXL1 among the first and second pixels PXL1 and PXL2 of FIG. 5 is schematically shown. The remaining pixels may be configured similarly to the first pixel PXL1.

Referring to FIGS. 7 and 8, the first pixel PXL1 may include the first to third sub-pixels SP1 to SP3 arranged in the first direction DR1.

The first sub-pixel SP1 may include a first emission area EMA1, and a non-emission area NEA around the first emission area EMA1. The second sub-pixel SP2 may include a second emission area EMA2, and a non-emission area NEA around the second emission area EMA2. The third sub-pixel SP3 may include a third emission area EMA3, and a non-emission area NEA around the third emission area EMA3.

The first emission area EMA1 may be an area where light is emitted from a portion of the light-emitting structure EMS (refer to FIG. 10) corresponding to the first sub-pixel SP1. The second emission area EMA2 may be an area where light is emitted from a portion of the light-emitting structure EMS corresponding to the second sub-pixel SP2. The third emission area EMA3 may be an area where light is emitted from a portion of the light-emitting structure EMS corresponding to the third sub-pixel SP3.

Figure 9:
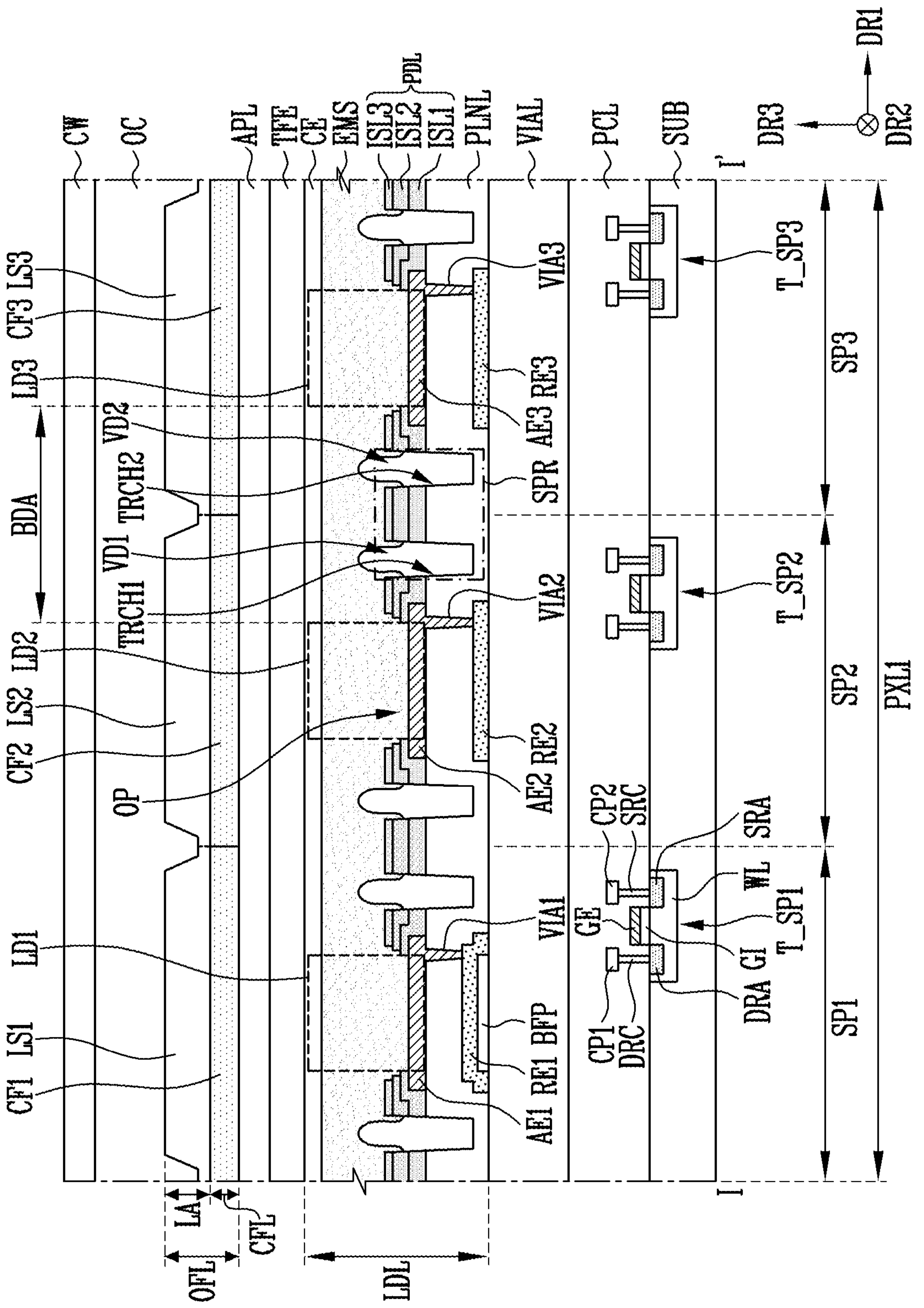
FIG. 9 is a cross-sectional view taken along the line I-I' of FIG. 8 according to one or more embodiments of the disclosure.

FIG. 9 is a cross-sectional view taken along the line I-I' of FIG. 8 according to one or more embodiments of the disclosure.

Referring to FIG. 9, the substrate SUB and the pixel circuit layer PCL located on the substrate SUB are provided.

The substrate SUB may include a silicon wafer substrate formed using a semiconductor process. For example, the substrate SUB may include silicon, germanium, and/or silicon-germanium.

The pixel circuit layer PCL is located on the substrate SUB. The substrate SUB and the pixel circuit layer PCL may include circuit elements of each of the first to third sub-pixels SP1 to SP3. For example, the substrate SUB and the pixel circuit layer PCL may include a transistor T_SP1 of the first sub-pixel SP1, a transistor T_SP2 of the second sub-pixel SP2, and a transistor T_SP3 of the third sub-pixel SP3. The transistor T_SP1 of the first sub-pixel SP1 may be one of the transistors included in the sub-pixel circuit SPC of the first sub-pixel SP1, the transistor T_SP2 of the second sub-pixel SP2 may be one of the transistors included in the sub-pixel circuit SPC of the second sub-pixel SP2, and the transistor T_SP3 of the third sub-pixel SP3 may be one of the transistors included in the sub-pixel circuit SPC of the third sub-pixel SP3. In FIG. 9, for clarify and concise description, one of the transistors of each sub-pixel is shown, and the remaining circuit elements are omitted.

The transistor T_SP1 of the first sub-pixel SP1 may include a source area SRA, a drain area DRA, and a gate electrode GE.

The source area SRA and drain area DRA may be located in the substrate SUB. A well WL formed through an ion injection process may be located in the substrate SUB, and the source area SRA and the drain area DRA may be located to be spaced apart from each other in the well WL. An area between the source area SRA and the drain area DRA in the well WL may be defined as a channel area. The gate electrode GE may overlap the channel area between the source area SRA and the drain area DRA, and may be located in the pixel circuit layer PCL. The gate electrode GE may be spaced apart from the well WL or the channel area by an insulating material, such as a gate-insulating layer GI. The gate electrode GE may include a conductive material.

A plurality of layers included in the pixel circuit layer PCL may include insulating layers, and conductive patterns located between respective ones of the insulating layers, and such conductive patterns may include first and second conductive patterns CP1 and CP2. The first conductive pattern CP1 may be electrically connected to the drain area DRA through a drain connection portion DRC passing through one or more insulating layers. The second conductive pattern CP2 may be electrically connected to the source area SRA through a source connection portion SRC passing through one or more insulating layers.

As the gate electrode GE and the first and second conductive patterns CP1 and CP2 are connected to different circuit elements and/or lines, the transistor T_SP1 of the first sub-pixel SP1 may be provided as one of the transistors of the first sub-pixel SP1.

Each of the transistor T_SP2 of the second sub-pixel SP2 and the transistor T_SP3 of the third sub-pixel SP3 may be configured similarly to the transistor T_SP1 of the first sub-pixel SP1.

As described above, the substrate SUB and the pixel circuit layer PCL may include the circuit elements of each of the first to third sub-pixels SP1 to SP3.

A via layer VIAL is located on the pixel circuit layer PCL. The via layer VIAL may cover the pixel circuit layer PCL, and may have an overall flat surface. The via layer VIAL is configured to planarize steps on the pixel circuit layer PCL. The via layer VIAL may include at least one of silicon oxide (SiOx), silicon nitride (SiNx), or silicon carbon nitride (SiCN), but embodiments are not limited thereto.

The light-emitting element layer LDL is located on the via layer VIAL. The light-emitting element layer LDL may include first to third reflective electrodes RE1 to RE3, a planarization layer PLNL, first to third anode electrodes AE1 to AE3, the pixel-defining layer PDL, the light-emitting structure EMS, and the cathode electrode CE.

On the via layer VIAL, the first to third reflective electrodes RE1 to RE3 are located in the first to third sub-pixels SP1 to SP3, respectively. Each of the first to third reflective electrodes RE1 to RE3 may contact the circuit element located in the pixel circuit layer PCL through a via passing through the via layer VIAL.

The first to third reflective electrodes RE1 to RE3 may function as a full mirror reflecting the light emitted from the light-emitting structure EMS toward the display surface (or the cover window CW). The first to third reflective electrodes RE1 to RE3 may include metal materials suitable for reflecting light. The first to third reflective electrodes RE1 to RE3 may include at least one of aluminum (Al), silver (Ag), magnesium (Mg), platinum (Pt), palladium (Pd), gold (Au), nickel (Ni), neodymium (Nd), iridium (Ir), chromium (Cr), titanium (Ti), or an alloy of two or more materials selected from them.

In embodiments, a connection electrode may be located under each of the first to third reflective electrodes RE1 to RE3. The connection electrode may improve an electrical connection characteristic between a corresponding reflective electrode and the circuit element of the pixel circuit layer PCL. The connection electrode may have a multilayer structure. The multilayer structure may include titanium (Ti), titanium nitride (TiN), tantalum nitride (TaN), or the like, but embodiments are not limited thereto. In embodiments, a corresponding reflective electrode may be positioned between multiple layers of the connection electrode.

A buffer pattern BFP may be located under at least one of the reflective electrodes RE1 to RE3. The buffer pattern BFP may include an inorganic material, such as silicon carbon nitride, but embodiments are not limited thereto. By including the buffer pattern BFP, a height of the third direction DR3 of a corresponding reflective electrode (e.g., first reflective electrode RE1) may be adjusted. For example, the buffer pattern BFP may be located between the first reflective electrode RE1 and the via layer VIAL to adjust a height of the first reflective electrode RE1.

The first to third reflective electrodes RE1 to RE3 may function as full mirrors, and the cathode electrode CE may function as a half mirror. For example, each of the first to third reflective electrodes RE1 to RE3 and the cathode electrode CE may provide a resonance structure in a corresponding sub-pixel. The light emitted from the light-emitting layer of the light-emitting structure EMS may be amplified by reciprocating between a corresponding reflective electrode and the cathode electrode CE, and the amplified light may be output through the cathode electrode CE. As described above, a distance between each reflective electrode and the cathode electrode CE may be understood as a resonance distance for the light emitted from the light-emitting layer of the corresponding light-emitting structure EMS.

The first sub-pixel SP1 may have a resonance distance that is less than that of other sub-pixels by the buffer pattern BFP. The resonance distance adjusted described above may allow light of a corresponding wavelength range (for example, red color) to be effectively and efficiently amplified. Accordingly, the first sub-pixel SP1 may effectively and efficiently output light of a corresponding wavelength range.

In FIG. 9, the buffer pattern BFP provided to the first sub-pixel SP1, and is not provided to the second and third sub-pixels SP2 and SP3, but embodiments are not limited thereto. The buffer pattern may also be provided in at least one of the second or third sub-pixel SP2 or SP3 to adjust the resonance distance of at least one of the second or third sub-pixel SP2 or SP3. For example, the first to third sub-pixels SP1 to SP3 may correspond to red, green, and blue, respectively, a distance between the first reflective electrode RE1 and the cathode electrode CE may be less than a distance between the second reflective electrode RE2 and the cathode electrode CE, and the distance between the second reflective electrode RE2 and the cathode electrode CE may be less than a distance between the third reflective electrode RE3 and the cathode electrode CE.

To planarize steps between the first to third reflective electrodes RE1 to RE3, the planarization layer PLNL may be located on the via layer VIAL and the first to third reflective electrodes RE1 to RE3. The planarization layer PLNL may generally cover the first to third reflective electrodes RE1 to RE3 and the via layer VIAL, and may have a flat surface. In embodiments, the planarization layer PLNL may be omitted.

On the planarization layer PLNL, first to third anode electrodes AE1 to AE3 respectively overlapping the first to third reflective electrodes RE1 to RE3 are located. The first to third anode electrodes AE1 to AE3 may have shapes respectively similar to those of the first to third emission areas EMA1 to EMA3 of FIG. 5 in the third direction DR3. The first to third anode electrodes AE1 to AE3 are respectively connected to the first to third reflective electrodes RE1 to RE3. The first anode electrode AE1 may be connected to the first reflective electrode RE1 through a first via VIA1 passing through the planarization layer PLNL. The second anode electrode AE2 may be connected to the second reflective electrode RE2 through a second via VIA2 passing through the planarization layer PLNL. The third anode electrode AE3 may be connected to the third reflective electrode RE3 through a third via VIA3 passing through the planarization layer PLNL.

In embodiments, the first to third anode electrodes AE1 to AE3 may include at least one of transparent conductive materials, such as indium tin oxide (ITO), indium zinc oxide (IZO), zinc oxide ($ZnO_x$), indium gallium zinc oxide (IGZO), or indium tin zinc oxide (ITZO). However, a material of the first to third anode electrodes AE1 to AE3 is not limited thereto. For example, the first to third anode electrodes AE1 to AE3 may include titanium nitride.

The pixel-defining layer PDL is located on portions of the first to third anode electrodes AE1 to AE3 and the planarization layer PLNL. The pixel-defining layer PDL has the opening OP exposing a portion of each of the first to third anode electrodes AE1 to AE3. An area overlapping the pixel-defining layer PDL may be understood as a boundary area BDA between neighboring sub-pixels.

In embodiments, the pixel-defining layer PDL may include a plurality of inorganic insulating layers. Each of the plurality of inorganic insulating layers may include at least one of silicon oxide (SiOx) or silicon nitride (SiNx). For example, the pixel-defining layer PDL may include a first inorganic insulating layer ISL1, a second inorganic insulating layer ISL2, and a third inorganic insulating layer ISL3 that are sequentially stacked. The first to third inorganic insulating layers ISL1 to ISL3 may include silicon nitride, silicon oxide, and silicon nitride, but embodiments are not limited thereto. The first to third inorganic insulating layers ISL1 to ISL3 may have a step-shaped cross-section in an area adjacent to the opening OP.

The pixel-defining layer PDL may include a separator SPR in the boundary area BDA between neighboring sub-pixels. In other words, the separator SPR may be provided in each of the boundary areas between the sub-pixels SP of FIG. 1.

The separator SPR may cause formation of a discontinuous portion in the light-emitting structure EMS in the boundary area BDA. For example, the light-emitting structure EMS may be disconnected or bent in the boundary area BDA due to the separator SPR. Therefore, the first to third emission areas EMA1 to EMA3 of FIG. 8 corresponding to the first to third sub-pixels SP1 to SP3 may be defined according to the separator SPR of the pixel-defining layer PDL.

Figure 12:
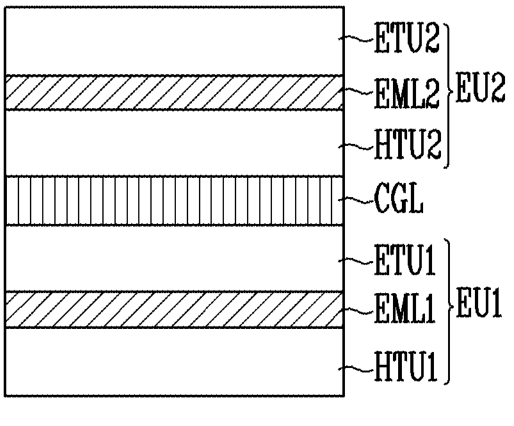
FIG. 12 is a cross-sectional view illustrating one or more embodiments of a light-emitting structure included in one of first to third light-emitting elements of FIG. 9 or FIG. 10.

The separator SPR may be provided in or on the pixel-defining layer PDL. The pixel-defining layer PDL may include one or more trenches TRCH1 and TRCH2 as the separator SPR in the boundary area BDA. In embodiments, as shown in FIG. 12, one or more trenches TRCH1 and TRCH2 may pass through the pixel-defining layer PDL, and may partially pass through the planarization layer PLNL. In other embodiments, one or more trenches TRCH1 and TRCH2 may pass through the pixel-defining layer PDL and the planarization layer PLNL, and may partially pass through the via layer VIAL. In other embodiments, one or more trenches TRCH1 and TRCH2 may at least partially pass through the planarization layer PLNL and/or the via layer VIAL, and a portion of the pixel-defining layer PDL may be located in one or more trenches TRCH1 and TRCH2.

In FIG. 9, the two trenches TRCH1 and TRCH2 are provided in the boundary area BDA. However, embodiments are not limited thereto. For example, the pixel-defining layer PDL may include one trench in the boundary area BDA. Alternatively, the pixel-defining layer PDL may include three or more trenches in the boundary area BDA.

Due to the first and second trenches TRCH1 and TRCH2, in the boundary area BDA, discontinuous portions, such as a first void VD1 and a second void VD2, may be formed in the light-emitting structure EMS. A portion of a plurality of layers stacked in the light-emitting structure EMS may be disconnected or bent by the first and second voids VD1 and VD2. For example, at least one charge generation layer and at least one hole injection layer included in the light-emitting structure EMS may be disconnected in the first and/or second voids VD1 and/or VD2. As described above, portions of the light-emitting structure EMS included in the first to third sub-pixels SP1 to SP3 may be at least partially separated due to the first and second trenches TRCH1 and TRCH2.

According to shapes of the first and second trenches TRCH1 and TRCH2, the discontinuous portions formed in the light-emitting structure EMS may be variously changed.

In embodiments, the light-emitting structure EMS may be formed through a process of vacuum deposition, inkjet printing, and the like. In this case, same materials as the light-emitting structure EMS may be positioned on bottom surfaces of the first and second trenches TRCH1 and TRCH2 adjacent to the via layer VIAL.

The pixel-defining layer PDL may include an additional separator so that the light-emitting structure EMS further includes a discontinuous portion adjacent to the boundary area BDA. In embodiments, the third inorganic insulating layer ISL3 of the uppermost portion among the first to third inorganic insulating layers ISL1 to ISL3 of the pixel-defining layer PDL may have a width that is greater than that of the second inorganic insulating layer ISL2 located directly thereunder. For example, the pixel-defining layer PDL may have a "T" shape or "I" shape of cross-section in the boundary area BDA. According to a shape of the pixel-defining layer PDL, a plurality of layers included in the light-emitting structure EMS may be at least partially disconnected or bent in the boundary area BDA or in an area adjacent to the boundary area BDA.

The light-emitting structure EMS may be located on the anode electrodes AE1 to AE3 exposed by the opening OP of the pixel-defining layer PDL. The light-emitting structure EMS may fill the opening OP of the pixel-defining layer PDL, and may be located entirely across the first to third sub-pixels SP1 to SP3. As described above, the light-emitting structure EMS may be at least partially disconnected or bent in the boundary area BDA by the separator SPR. Accordingly, a current flowing out from each of the first to third sub-pixels SP1 to SP3 to a sub-pixel adjacent thereto through layers included in the light-emitting structure EMS may decrease in case that the display panel DP is operated. Therefore, the first to third light-emitting elements LD1 to LD3 may operate with relatively high reliability.

The cathode electrode CE may be located on the light-emitting structure EMS. The cathode electrode CE may be commonly provided to the first to third sub-pixels SP1 to SP3. The cathode electrode CE may function as a half mirror that partially transmits and partially reflects the light emitted from the light-emitting structure EMS.

The first anode electrode AE1, a portion of the light-emitting structure EMS overlapping the first anode electrode AE1, and a portion of the cathode electrode CE overlapping the first anode electrode AE1 may configure the first light-emitting element LD1. The second anode electrode AE2, a portion of the light-emitting structure EMS overlapping the second anode electrode AE2, and a portion of the cathode electrode CE overlapping the second anode electrode AE2 may configure the second light-emitting element LD2. The third anode electrode AE3, a portion of the light-emitting structure EMS overlapping the third anode electrode AE3, and a portion of the cathode electrode CE overlapping the third anode electrode AE3 may configure the third light-emitting element LD3.

The encapsulation layer TFE is located on the cathode electrode CE. The encapsulation layer TFE may reduce or prevent oxygen, moisture, and/or the like from permeating to the light-emitting element layer LDL.

The optical functional layer OFL is located on the encapsulation layer TFE. In embodiments, the optical functional layer OFL may be attached to the encapsulation layer TFE through an adhesive layer APL. For example, the optical functional layer OFL may be separately manufactured and attached to the encapsulation layer TFE through the adhesive layer APL. The adhesive layer APL may further perform a function of protecting lower layers including the encapsulation layer TFE.

The optical functional layer OFL may include the color filter layer CFL and the lens array LA. The color filter layer CFL may include first to third color filters CF1 to CF3 respectively corresponding to the first to third sub-pixels SP1 to SP3. The first to third color filters CF1 to CF3 may pass light of different respective wavelength ranges. For example, the first to third color filters CF1 to CF3 may pass light of red, green, and blue colors, respectively.

In embodiments, the first to third color filters CF1 to CF3 may partially overlap in the boundary area BDA. In other embodiments, the first to third color filters CF1 to CF3 may be spaced apart from each other, and a black matrix may be provided between the first to third color filters CF1 to CF3.

The lens array LA is located on the color filter layer CFL. The lens array LA may include first to third lenses LS1 to LS3 respectively corresponding to the first to third sub-pixels SP1 to SP3. Each of the first to third lenses LS1 to LS3 may improve light output efficiency by outputting light emitted from the first to third light-emitting elements LD1 to LD3 to an intended path.

The overcoat layer OC may be located on the lens array LA. The overcoat layer OC is configured to protect lower layers thereof from a foreign substance, such as dust or moisture. The cover window CW may be located on the overcoat layer OC.

Figure 11:
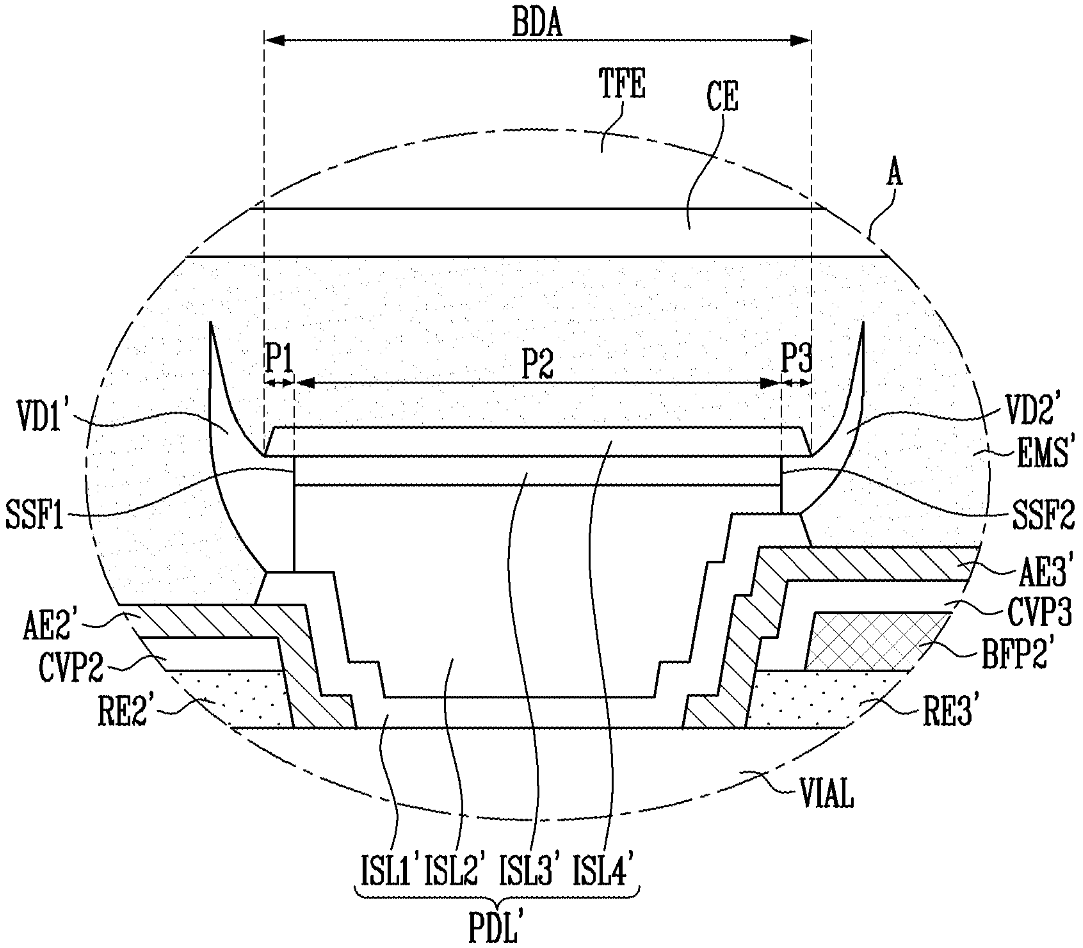
FIG. 11 is an enlarged view illustrating area A of FIG. 10.

FIG. 10 is a cross-sectional view taken along the line I-I' of FIG. 8 according to one or more other embodiments. FIG. 11 is an enlarged view illustrating area A of FIG. 10.

Referring to FIG. 10, a pixel circuit layer PCL and a via layer VIAL are located on a substrate SUB. The substrate SUB, the pixel circuit layer PCL, and the via layer VIAL of FIG. 10 are configured similarly to the substrate SUB, the pixel circuit layer PCL, and the via layer VIAL of FIG. 9, respectively. Hereinafter, an overlapping description is omitted.

A light-emitting element layer LDL' is located on the via layer VIAL. The light-emitting element layer LDL' may include first to third reflective electrodes RE1' to RE3', first and second buffer patterns BFP1' and BFP2', first to third cover patterns CVP1 to CVP3, first to third anode electrodes AE1' to AE3', a pixel-defining layer PDL', a light-emitting structure EMS', and a cathode electrode CE.

On the via layer VIAL, the first to third reflective electrodes RE1' to RE3' are respectively located in the first to third sub-pixels SP1 to SP3. Each of the first to third reflective electrodes RE1' to RE3' may contact a circuit element located in the pixel circuit layer PCL through a via passing through the via layer VIAL.

The first to third reflective electrodes RE1' to RE3' are configured to reflect light emitted from the light-emitting structure EMS' toward the display surface (or the cover window CW). The first to third reflective electrodes RE1' to RE3' may include metal materials suitable for reflecting light. The first to third reflective electrodes RE1' to RE3' may include at least one of aluminum (Al), silver (Ag), magnesium (Mg), platinum (Pt), palladium (Pd), gold (Au), nickel (Ni), neodymium (Nd), iridium (Ir), chromium (Cr), titanium (Ti), or an alloy of two or more materials selected therefrom, but embodiments are not limited thereto.

In one or more embodiments, a connection electrode may be further provided between each of the first to third reflective electrodes RE1' to RE3' and the via layer VIAL. The connection electrode may improve an electrical connection characteristic between a corresponding reflective electrode and the circuit elements of the pixel circuit layer PCL. The connection electrode may have a multilayer structure. The multilayer structure may include titanium (Ti), aluminum (Al), titanium nitride (TiN), tantalum nitride (TaN), and the like, but embodiments are not limited thereto. In embodiments, a corresponding reflective electrode may be positioned between multilayers of the connection electrode.

A buffer pattern may be located on at least one of the first to third reflective electrodes RE1' to RE3'. In embodiments, the first and second buffer patterns BFP1' and BFP2' may be located on the first and third reflective electrodes RE1' and RE3', respectively. Heights of the first and third anode electrodes AE1' and AE3' in the third direction DR3 may be adjusted by the first and second buffer patterns BFP1' and BFP2'. The first and second buffer patterns BFP1' and BFP2' may include inorganic material, such as silicon oxide (SiOx) and silicon nitride (SiNx), but embodiments are not limited thereto.

The first to third cover patterns CVP1 to CVP3 may be located on the first to third reflective electrodes RE1' to RE3', respectively. In the first sub-pixel SP1, the first cover pattern CVP1 is located on the first reflective electrode RE1' and the first buffer pattern BFP1'. In the second sub-pixel SP1, the second cover pattern CVP2 is located on the second reflective electrode RE2'. In the third sub-pixel SP3, the third cover pattern CVP3 is located on the third reflective electrode RE3' and the second buffer pattern BFP2'. The first to third cover patterns CVP1 to CVP3 may be formed after the first and second buffer patterns BFP1' and BFP2' are formed during a manufacturing process. The first to third cover patterns CVP1 to CVP3 may include a same material as the first and second buffer patterns BFP1' and BFP2'. For example, the first to third cover patterns CVP1 to CVP3 may include an inorganic material, such as silicon oxide (SiOx) and silicon nitride (SiNx), but embodiments are not limited thereto.

The first to third anode electrodes AE1' to AE3' are located on the first to third cover patterns CVP1 to CVP3, respectively. In embodiments, the first anode electrode AE1' may cover the first cover pattern CVP1, the first buffer pattern BFP1', and the first reflective electrode RE1'. The second anode electrode AE2' may cover the second cover pattern CVP2 and the second reflective electrode RE2'. The third anode electrode AE3' may cover the third cover pattern CVP3, the second buffer pattern BFP2', and the third reflective electrode RE3'.

The first to third anode electrodes AE1' to AE3' may be electrically connected to the first to third reflective electrodes RE1' to RE3', respectively. For example, each anode electrode may be connected to an end (or an edge) of a corresponding reflective electrode. However, embodiments are not limited thereto. To improve an electrical connection characteristic between the anode electrode and the reflective electrode, the anode electrode may be connected to the reflective electrode in various methods.

In embodiments, the first to third anode electrodes AE1' to AE3' may include at least one of transparent conductive materials, such as indium tin oxide (ITO), indium zinc oxide (IZO), zinc oxide (ZnOx), indium gallium zinc oxide (IGZO), or indium tin zinc oxide (ITZO). However, a material of the first to third anode electrodes AE1' to AE3' is not limited thereto. For example, the first to third anode electrodes AE1' to AE3' may include titanium nitride.

The first to third anode electrodes AE1' to AE3' may have shapes similar to those of the first to third light-emitting regions EMA1 to EMA3 of FIG. 8 in the third direction DR3.

The first to third anode electrodes AE1' to AE3' and the cathode electrode CE may partially reflect incident light. Light emitted from a light-emitting layer of the light-emitting structure EMS' may be amplified by reciprocating between a corresponding anode electrode and the cathode electrode CE, and may be output through the cathode electrode CE. For example, each anode electrode and the cathode electrode CE may provide a resonance structure in a corresponding sub-pixel. In this case, a distance between each anode electrode and the cathode electrode CE may be understood as a resonance distance for a light emitted from a light-emitting layer of a corresponding light-emitting structure EMS'.

The first to third sub-pixels SP1 to SP3 may correspond to red, green, and blue, respectively. In this case, a height of the third direction DR3 of the first and third anode electrodes AE1' and AE3' may be higher than that of the second anode electrode AE2' by the first and second buffer patterns BFP1' and BFP2'. Accordingly, the first and third sub-pixels SP1 and SP3 may have a resonance distance less than that of the second sub-pixel SP2 by the first and second buffer patterns BFP1' and BFP2'. As described above, a resonance distance of each sub-pixel may be adjusted so that light of a wavelength range of a corresponding color is effectively and efficiently amplified.

In FIG. 10, the first and second buffer patterns BFP1' and BFP2' are respectively located under the first and third anode electrodes AE1' and AE3', but embodiments are not limited thereto. For example, one of the first or second buffer pattern BFP1' or BFP2' may be omitted. As another example, both of the first and second buffer patterns BFP1' and BFP2' may be omitted. In this case, the resonance distance between each anode electrode and the cathode electrode CE may be the same. As still another example, a buffer pattern may be located under each of the first to third anode electrodes AE1' to AE3'. In this case, the buffer pattern located under each anode electrode may have different thicknesses, and thus the respective resonance distances between each anode electrode and the cathode electrode CE may be different from each other. As described above, by providing a buffer pattern for adjusting a height of a corresponding anode electrode under at least one of the first to third anode electrodes AE1' to AE3', a resonance distance in each sub-pixel may be optimized.

The pixel-defining layer PDL' is located on portions of the first to third anode electrodes AE1' to AE3' and the via layer VIAL. The pixel-defining layer PDL' has an opening OP' that exposes a portion of each of the first to third anode electrodes AE1' to AE3'. An area overlapping the pixel-defining layer PDL' may be understood as a boundary area BDA between neighboring sub-pixels.

The pixel-defining layer PDL' may include a plurality of sequentially stacked inorganic insulating layers. Each of the plurality of inorganic insulating layers may include at least one of silicon oxide (SiOx) or silicon nitride (SiNx). However, embodiments are not limited thereto. For example, the pixel-defining layer PDL' may include an organic insulating layer.

In embodiments, the pixel-defining layer PDL' may include first to fourth inorganic insulating layers ISL1' to ISL4'. The first inorganic insulating layer ISL1' may cover portions of the first to third anode electrodes AE1' to AE3' and the via layer VIAL. The second inorganic insulating layer ISL2' is located on the first inorganic insulating layer ISL1', the third inorganic insulating layer ISL3' is located on the second inorganic insulating layer ISL2', and the fourth inorganic insulating layer ISL4' is located on the third inorganic insulating layer ISL3'. The first and third inorganic insulating layers ISL1' and ISL3' may include silicon nitride (SiNx), and the second and fourth inorganic insulating layers ISL2' and ISL4' may include silicon oxide (SiOx), but embodiments are not limited thereto. In embodiments, the first inorganic insulating layer ISL1' may be omitted.

The pixel-defining layer PDL' may include a separator SPR' in the boundary area BDA between neighboring sub-pixels. The separator SPR' may cause a discontinuous portion, such as a void VD' to be formed in the light-emitting structure EMS'. Due to the discontinuous portion, at least a portion of layers included in the light-emitting structure EMS' may be disconnected or bent.

The fourth inorganic insulating layer ISL4' may have a width that is greater than that of the second and third inorganic insulating layers ISL2' and ISL3'. In this case, side surfaces of the second to fourth inorganic insulating layers ISL2' to ISL4' adjacent to the opening OP' may be provided as the separator SPR'.

Referring to FIG. 11 together with FIG. 10, the fourth inorganic insulating layer ISL4' may include first to third portions P1 to P3. The second portion P2 may completely overlap the second and third inorganic insulating layers ISL2' and ISL3'. The first portion P1 protrudes from the second portion P2 in a direction opposite to the first direction DR1. The third portion P3 protrudes from the second portion P2 in the first direction DR1. As described above, a width of the fourth inorganic insulating layer ISL4' may be greater than that of the second and third inorganic insulating layers ISL2' and ISL3'. For example, during a manufacturing process, the second and third inorganic insulating layers ISL2' and ISL3' may be undercut so as not to include a portion overlapping the first and third portions P1 and P3. For example, each of the first and third portions P1 and P3 of the fourth inorganic insulating layer ISL4' may have a shape of eaves above the second and third inorganic insulating layers ISL2' and ISL3'.

In the boundary area BDA, the second and third inorganic insulating layers ISL2' and ISL3' may have the same width. However, embodiments are not limited thereto, and the second and third inorganic insulating layers ISL2' and ISL3' may have different widths. For example, the second inorganic insulating layer ISL2' may have a width that is greater than that of the third inorganic insulating layer ISL3'. As another example, the third inorganic insulating layer ISL3' may have a width that is greater than that of the second inorganic insulating layer ISL2'.

In the second sub-pixel SP2, the first portion P1 of the fourth inorganic insulating layer ISL4' and a first side surface SSF1 of the second and third inorganic insulating layers ISL2' and ISL3' may be provided as one separator SPR'. Accordingly, a first void VD1' adjacent to the first portion P1 of the fourth inorganic insulating layer ISL4' in the light-emitting structure EMS' may be formed. In the third sub-pixel SP3, the third portion P3 of the fourth inorganic insulating layer ISL4' and a second side surface SSF2 of the second and third inorganic insulating layers may be provided as another separator SPR'. Accordingly, a second void VD2' adjacent to the third portion P3 of the fourth inorganic insulating layer ISL4' in the light-emitting structure EMS' may be formed.

A portion of a plurality of layers stacked in the light-emitting structure EMS' may be disconnected or bent by the first and second voids VD1' and VD2'. For example, at least one charge generation layer and at least one hole injection layer included in the light-emitting structure EMS' may be disconnected by the first and second voids VD1' and VD2'. As described above, due to the separator SPR', portions of the light-emitting structure EMS' included in the first to third sub-pixels SP1 to SP3 may be at least partially separated from each other.

The pixel-defining layer PDL' may include an additional separator so that the light-emitting structure EMS' further includes a discontinuous portion in the boundary area BDA. In embodiments, the pixel-defining layer PDL' may include one or more trenches as a separator in the boundary area BDA. The trenches may pass through one or more of the first to fourth inorganic insulating layers ISL1' to ISL4'. Due to the trenches, a portion of the plurality of layers stacked in the light-emitting structure EMS', for example, at least one charge generation layer and at least one hole injection layer, may be disconnected or bent. In embodiments, the light-emitting structure EML' may have a structure in which three light-emitting units, each including an light-emitting layer, are stacked, and two charge generation layers may be located between the three light-emitting units. In these embodiments, the pixel-defining layer PDL' may include one or more trenches in the boundary area BDA.

Referring to FIG. 10 again, the light-emitting structure EMS' may be located on the anode electrodes AE exposed by the opening OP' of the pixel-defining layer PDL'. The light-emitting structure EMS' may fill the opening OP' of the pixel-defining layer PDL', and may be located entirely over the first to third sub-pixels SP1 to SP3. As described above, the light-emitting structure EMS' may be disconnected or bent by the separator SPR' in the boundary area BDA or in an area adjacent to the boundary area BDA. Accordingly, current flowing from each of the first to third sub-pixels SP1 to SP3 to a sub-pixel neighboring each of the first to third sub-pixels SP1 to SP3 through the layers included in the light-emitting structure EMS' may be reduced in case that the display panel DP is operated. Therefore, first to third light-emitting elements LD1' to LD3' may operate with relatively high reliability.

In embodiments, the light-emitting structure EMS' may include two light-emitting units sequentially stacked, and each of the light-emitting units may include a light-emitting layer configured to generate light according to an applied current. In other embodiments, the light-emitting structure EMS' may include three light-emitting units sequentially stacked, and each of the light-emitting units may include a light-emitting layer configured to generate light according to an applied current. In these embodiments, a charge generation layer may be located between the light-emitting units.

In embodiments, the light-emitting structure EMS' may be formed through a process of vacuum deposition, inkjet printing, and the like.

The cathode electrode CE may be located on the light-emitting structure EMS'. The cathode electrode CE may be commonly provided to the first to third sub-pixels SP1 to SP3.

The first anode electrode AE1', a portion of a light-emitting structure EMS' overlapping the first anode electrode AE1', and a portion of the cathode electrode CE overlapping the first anode electrode AE1' may configure the first light-emitting element LD1'. The second anode electrode AE2', a portion of the light-emitting structure EMS' overlapping the second anode electrode AE2', and a portion of the cathode electrode CE overlapping the second anode electrode AE2' may configure the second light-emitting element LD2'. The third anode electrode AE3', a portion of the light-emitting structure EMS' overlapping the third anode electrode AE3', and a portion of the cathode electrode CE overlapping the third anode electrode AE3' may configure the third light-emitting element LD3'.

The encapsulation layer TFE is located on the cathode electrode CE. The encapsulation layer TFE may reduce or prevent oxygen, moisture, and/or the like from penetrating into the light-emitting element layer LDL'.

The adhesive layer APL, the optical functional layer OFL, the overcoat layer OC, and the cover window CW are located on the encapsulation layer TFE. The adhesive layer APL, the optical functional layer OFL, the overcoat layer OC, and the cover window CW are configured similarly to the adhesive layer APL, the optical functional layer OFL, the overcoat layer OC, and the cover window CW of FIG. 12, respectively. An overlapping description of these is omitted.

FIG. 12 is a cross-sectional view illustrating one or more embodiments of a light-emitting structure included in one of the first to third light-emitting elements of FIG. 9 or 10.

Referring to FIG. 12, the light-emitting structure may have a tandem structure in which first and second light-emitting units EU1 and EU2 are stacked. The light-emitting structure may be configured substantially equally in each of the first to third light-emitting elements LD1 to LD3 of FIG. 9.

Each of the first and second light-emitting units EU1 and EU2 may include at least one light-emitting layer that generates light according to an applied current. The first light-emitting unit EU1 may include a first light-emitting layer EML1, a first electron transport unit ETU1, and a first hole transport unit HTU1. The first light-emitting layer EML1 may be located between the first electron transport unit ETU1 and the first hole transport unit HTU1. The second light-emitting unit EU2 may include a second light-emitting layer EML2, a second electron transport unit ETU2, and a second hole transport unit HTU2. The second light-emitting layer EML2 may be located between the second electron transport unit ETU2 and the second hole transport unit HTU2.

Each of the first and second hole transport units HTU1 and HTU2 may include at least one of a hole injection layer or a hole transport layer, and may further include a hole buffer layer, an electron-blocking layer, and the like if suitable. The first and second hole transport units HTU1 and HTU2 may have configurations equal to each other or different from each other.

Each of the first and second electron transport units ETU1 and ETU2 may include at least one of an electron injection layer or an electron transport layer, and may further include an electron buffer layer, a hole-blocking layer, and the like if suitable. The first and second electron transport units ETU1 and ETU2 may have configurations equal to each other or different from each other.

A connection layer, which may be provided in a form of a charge generation layer CGL, may be located between the first light-emitting unit EU1 and the second light-emitting unit EU2 to connect the first light-emitting unit EU1 and the second light-emitting unit EU2 to each other. In embodiments, the charge generation layer CGL may have a stack structure of a p dopant layer and an n dopant layer. For example, the p dopant layer may include a p-type dopant, such as HAT-CN, TCNQ, and NDP-9, and the n dopant layer may include an alkali metal, an alkaline earth metal, a lanthanide metal, or a combination thereof. However, embodiments are not limited thereto.

In embodiments, the first light-emitting layer EML1 and the second light-emitting layer EML2 may generate light of different colors. Light emitted from each of the first light-emitting layer EML1 and the second light-emitting layer EML2 may be mixed and viewed as white light. For example, the first light-emitting layer EML1 may generate blue light, and the second light-emitting layer EML2 may generate yellow light. In embodiments, the second light-emitting layer EML2 may include a structure in which a first sub light-emitting layer configured to generate red light and a second sub light-emitting layer configured to generate green light are stacked. The red light and the green light may be mixed, and thus the yellow light may be provided. In this case, an intermediate layer configured to perform a function of transporting holes and/or blocking transport of electrons may be further located between the first and second sub light-emitting layers.

In other embodiments, the first light-emitting layer EML1 and the second light-emitting layer EML2 may generate light of the same color.

The light-emitting structure may be formed through a method of vacuum deposition, inkjet printing, and the like, but embodiments are not limited thereto.

Figure 13:
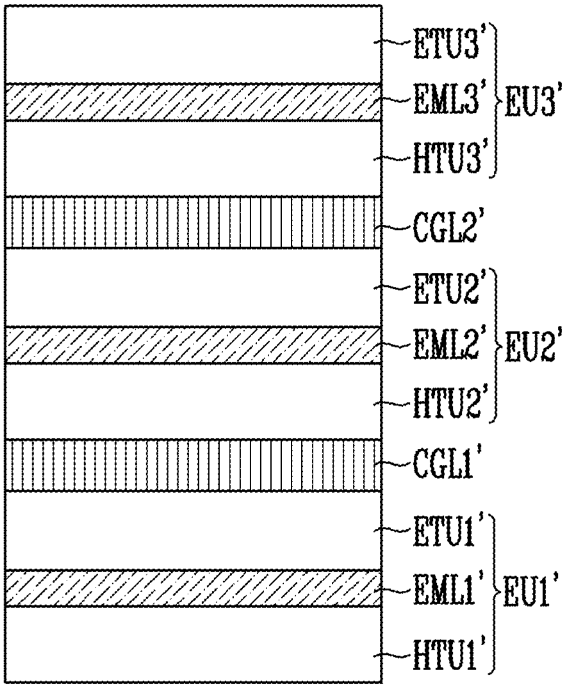
FIG. 13 is a cross-sectional view illustrating one or more other embodiments of a portion of the light-emitting structure included in one of the first to third light-emitting elements of FIG. 9 or FIG. 10.

FIG. 13 is a cross-sectional view illustrating one or more other embodiments of a portion of the light-emitting structure included in one of the first to third light-emitting elements of FIG. 9 or 10.

Referring to FIG. 13, the light-emitting structure may have a tandem structure in which first to third light-emitting units EU1' to EU3' are stacked. The light-emitting structure may be configured substantially equally in each of the first to third light-emitting elements LD1 to LD3 of FIG. 9.

Each of the first to third light-emitting units EU1' to EU3' may include a light-emitting layer that generates light according to an applied current. The first light-emitting unit EU1' may include a first light-emitting layer EML1', a first electron transport unit ETU1', and a first hole transport unit HTU1'. The first light-emitting layer EML1' may be located between the first electron transport unit ETU1' and the first hole transport unit HTU1'. The second light-emitting unit EU2' may include a second light-emitting layer EML2', a second electron transport unit ETU2', and a second hole transport unit HTU2'. The second light-emitting layer EML2' may be located between the second electron transport unit ETU2' and the second hole transport unit HTU2'. The third light-emitting unit EU3' may include a third light-emitting layer EML3', a third electron transport unit ETU3', and a third hole transport unit HTU3'. The third light-emitting layer EML3' may be located between the third electron transport unit ETU3' and the third hole transport unit HTU3'.

Each of the first to third hole transport units HTU1' to HTU3' may include at least one of a hole injection layer or a hole transport layer, and may further include a hole buffer layer, an electron-blocking layer, and the like if suitable. The first to third hole transport units HTU1' to HTU3' may have configurations equal to each other or different from each other.

Each of the first to third electron transport units ETU1' to ETU3' may include at least one of an electron injection layer or an electron transport layer, and may further include an electron buffer layer, a hole-blocking layer, and the like, if suitable. The first to third electron transport units ETU1' to ETU3' may have configurations equal to each other or different from each other.

A first charge generation layer CGL1' is located between the first light-emitting unit EU1' and the second light-emitting unit EU2'. A second charge generation layer CGL2' is located between the second light-emitting unit EU2' and the third light-emitting unit EU3'.

In embodiments, the first to third light-emitting layers EML1' to EML3' may generate light of different colors. Light emitted from each of the first to third light-emitting layers EML1' to EML3' may be mixed and may be viewed as white light. For example, the first emitting layer EML1' may generate light of a blue color, the second emitting layer EML2' may generate light of a green color, and the third emitting layer EML3' may generate light of a red color.

In other embodiments, two or more of the first to third light-emitting layers EML1' to EML3' may generate light of the same color.

Differently from that shown in FIGS. 12 and 13, the light-emitting structure of FIG. 9 or 10 may include one light-emitting unit in each of the first to third light-emitting elements LD1 to LD3. At this time, the light-emitting unit included in each of the first to third light-emitting elements LD1 to LD3 may be configured to emit light of different colors. For example, the light-emitting unit of the first light-emitting element LD1 may emit the light of the red color, the light-emitting unit of the second light-emitting element LD2' may emit the light of the green light, and the light-emitting unit of the third light-emitting element LD3 may emit the light of the blue color. In this case, the light-emitting units of the first to third sub-pixels SP1 to SP3 may be separated from each other, and each of them may be located in the opening (refer to OP of FIG. 9 and OP' of FIG. 10) of the pixel-defining layer (refer to PDL of FIG. 9 and PDL' of FIG. 10). In this case, at least a portion of the color filters CF1 to CF3 may be omitted.

Figure 14:
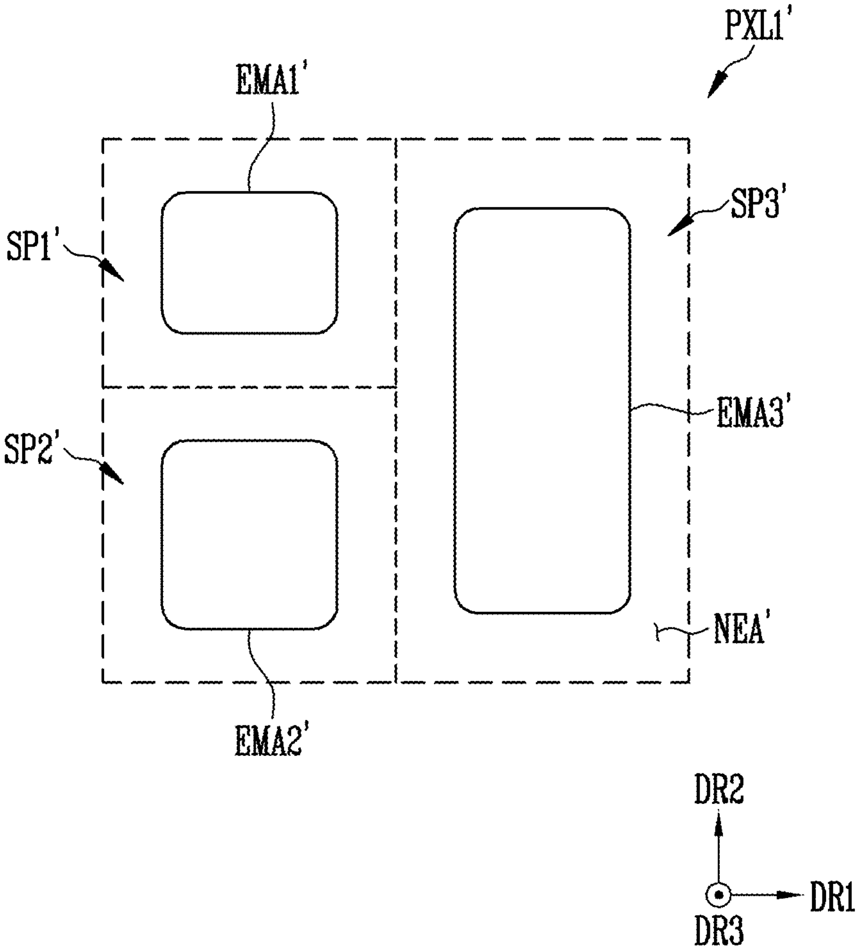
FIG. 14 is a plan view illustrating one or more other embodiments of one of the pixels of FIG. 7.

FIG. 14 is a plan view illustrating one or more other embodiments of one of the pixels of FIG. 7.

Referring to FIG. 14, a first pixel PXL1' may include first to third sub-pixels SP1' to SP3'.

The first sub-pixel SP1' may include a first emission area EMA1' and a non-emission area NEA' around the first emission area EMA1'. The second sub-pixel SP2' may include a second emission area EMA2' and a non-emission area NEA' around the second emission area EMA2'. The third sub-pixel SP3' may include a third emission area EMA3' and a non-emission area NEA' around the third emission area EMA3'.

The first sub-pixel SP1' and the second sub-pixel SP2' may be arranged in the second direction DR2. The third sub-pixel SP3' may be arranged in the first direction DR1 with respect to each of the first and second sub-pixels SP1' and SP2'.

The second sub-pixel SP2' may have an area that is greater than that of the first sub-pixel SP1', and the third sub-pixel SP3' may have an area that is greater than that of the second sub-pixel SP2'. Accordingly, the second emission area EMA2' may have an area that is greater than the first emission area EMA1', and the third emission area EMA3' may have an area that is greater than that of the second emission area EMA2'. However, embodiments are not limited thereto. For example, the first and second sub-pixels SP1' and SP2' may have substantially the same area, and the third sub-pixel SP3' may have an area that is greater than that of each of the first and second sub-pixels SP1' and SP2'. As described above, the areas of the first to third sub-pixels SP1' to SP3' may vary according to embodiments.

Figure 15:
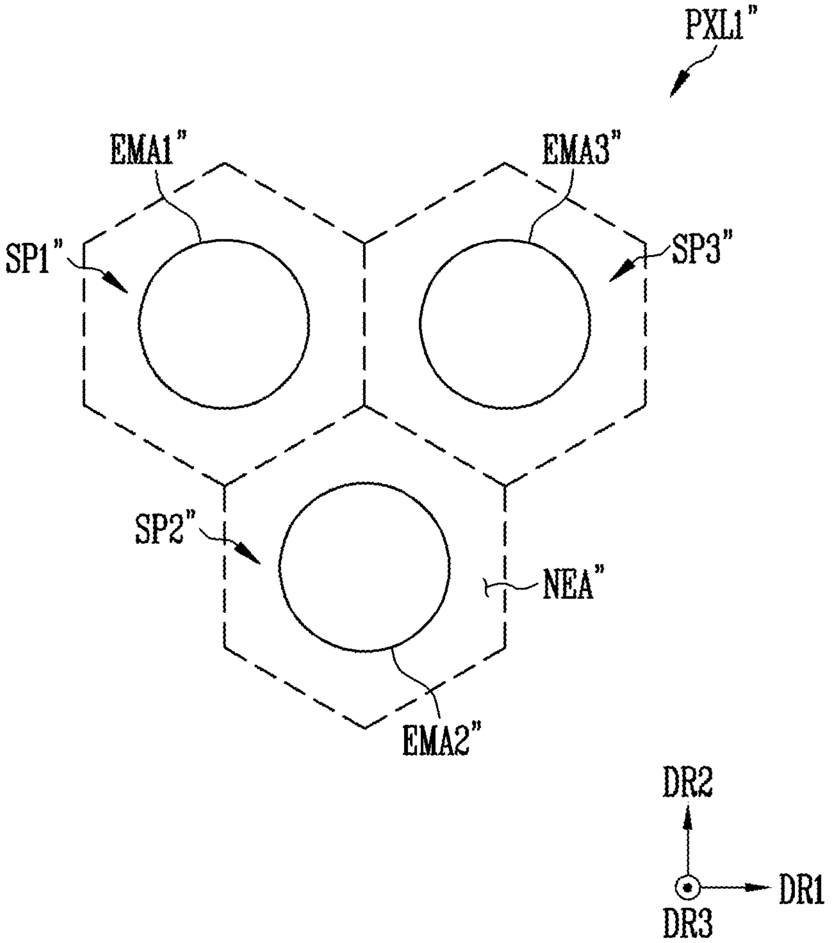
FIG. 15 is a plan view illustrating one or more other embodiments of one of the pixels of FIG. 7.

FIG. 15 is a plan view illustrating still one or more other embodiments of one of the pixels of FIG. 7.

Referring to FIG. 15, a first sub-pixel SP1" may include a first emission area EMA1" and a non-emission area NEA" around the first emission area EMA1". A second sub-pixel SP2" may include a second emission area EMA2" and a non-emission area NEA" around the second emission area EMA2". A third sub-pixel SP3" may include a third emission area EMA3" and a non-emission area NEA" around the third emission area EMA3".

The first to third sub-pixels SP1" to SP3" may have polygonal shapes in the third direction DR3. For example, shapes of the first to third sub-pixels SP1" to SP3" may be hexagonal shapes as shown in FIG. 15.

The first to third emission areas EMA1" to EMA3" may have circular shapes in the third direction DR3. However, embodiments are not limited thereto. For example, each of the first to third emission areas EMA1" to EMA3" may have a polygonal shape.

The first and third sub-pixels SP1" and SP3" may be arranged in the first direction DR1. The second sub-pixel SP2" may be located in a direction inclined by an acute angle based on the second direction DR2 (or a diagonal direction) with respect to the first sub-pixel SP1".

An arrangement of the sub-pixels shown in FIGS. 8, 14, and 15 is only an example, and embodiments are not limited thereto. Each pixel may include two or more sub-pixels, the sub-pixels may be arranged in various methods, the respective sub-pixels may have various shapes, and respective emission areas thereof may also have various shapes.

Figure 16:
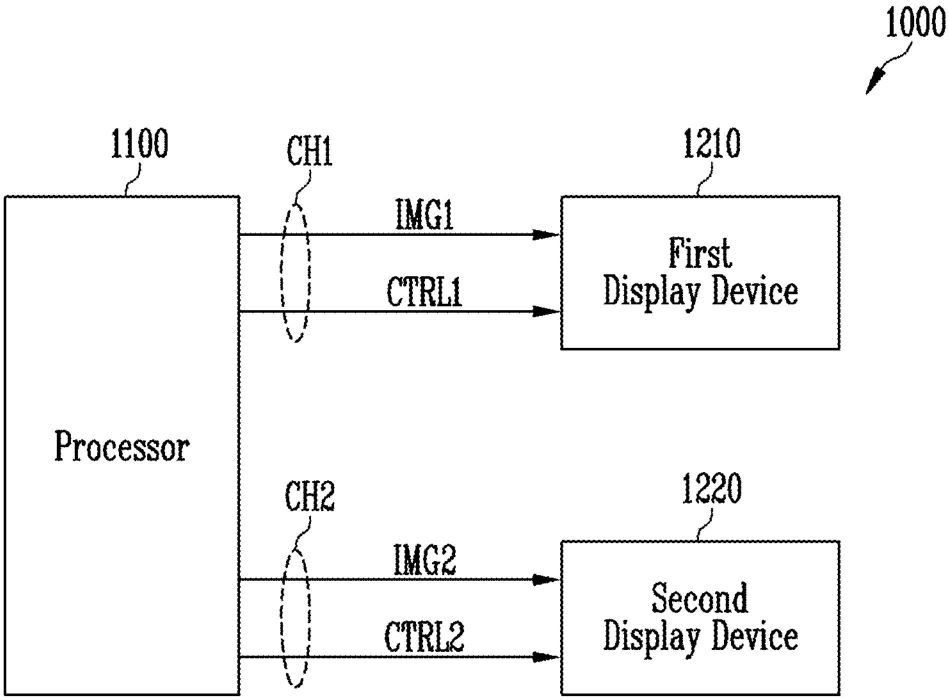
FIG. 16 is a block diagram illustrating one or more embodiments of a display system.

FIG. 16 is a block diagram illustrating one or more embodiments of a display system.

Referring to FIG. 16, the display system 1000 may include a processor 1100 and one or more display devices 1210 and 1220.

The processor 1100 may perform various tasks and calculations. In embodiments, the processor 1100 may include an application processor, a graphic processor, a microprocessor, a central processing unit (CPU), and the like. The processor 1100 may be connected to other components of the display system 1000 through a bus system and may control the other components.

In FIG. 16, the display system 1000 includes the first and second display devices 1210 and 1220. The processor 1100 may be connected to the first display device 1210 through a first channel CH1 and may be connected to the second display device 1220 through a second channel CH2.

Through the first channel CH1, the processor 1100 may transmit first image data IMG1 and a first control signal CTRL1 to the first display device 1210. The first display device 1210 may display an image based on the first image data IMG1 and the first control signal CTRL1. The first display device 1210 may be configured similarly to the display device 100 described with reference to FIG. 1. In this case, the first image data IMG1 and the first control signal CTRL1 may be provided as the input image data IMG and the control signal CTRL of FIG. 1, respectively.

Through the second channel CH2, the processor 1100 may transmit second image data IMG2 and a second control signal CTRL2 to the second display device 1220. The second display device 1220 may display an image based on the second image data IMG2 and the second control signal CTRL2. The second display device 1220 may be configured similarly to the display device 100 described with reference to FIG. 1. In this case, the second image data IMG2 and the second control signal CTRL2 may be provided as the input image data IMG and the control signal CTRL of FIG. 1, respectively.

The display system 1000 may include a computing system providing an image display function, such as a portable computer, a mobile phone, a smart phone, a tablet personal computer (PC), a smart watch, a watch phone, a portable multimedia player (PMP), a navigation device, and an ultra-mobile personal computer (UMPC). In addition, the display system 1000 may include at least one of a head-mounted display (HMD) device, a virtual reality (VR) device, a mixed reality (MR) device, or an augmented reality (AR) device.

Figure 17:
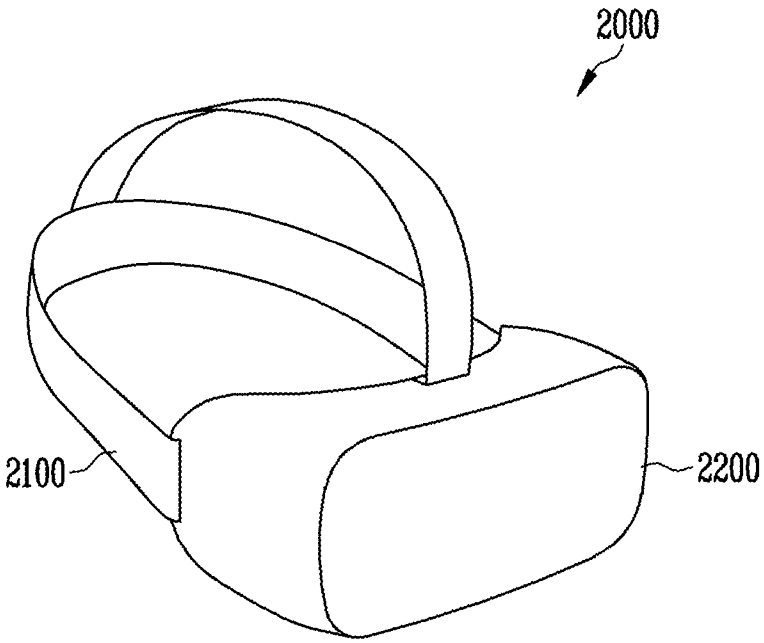
FIG. 17 is a perspective view illustrating an application example of the display system of FIG. 16.

FIG. 17 is a perspective view illustrating an application example of the display system of FIG. 16.

Referring to FIG. 17, the display system 1000 of FIG. 16 may be applied to a head-mounted display device 2000. The head-mounted display device 2000 may be a wearable electronic device that may be worn on a user's head.

The head-mounted display device 2000 may include a head mount band 2100 and a display device receiving case 2200. The head mount band 2100 may be connected to the display device receiving case 2200. The head mount band 2100 may include a horizontal band and/or a vertical band for fixing the head-mounted display device 2000 to the user's head. The horizontal band may be configured to surround a side portion of the user's head, and the vertical band may be configured to surround an upper portion of the user's head. However, embodiments are not limited thereto. For example, the head mount band 2100 may be implemented in a glasses frame form, a helmet form, or the like.

The display device receiving case 2200 may receive the first and second display devices 1210 and 1220 of FIG. 16. The display device receiving case 2200 may further receive the processor 1100 of FIG. 16.

Figure 18:
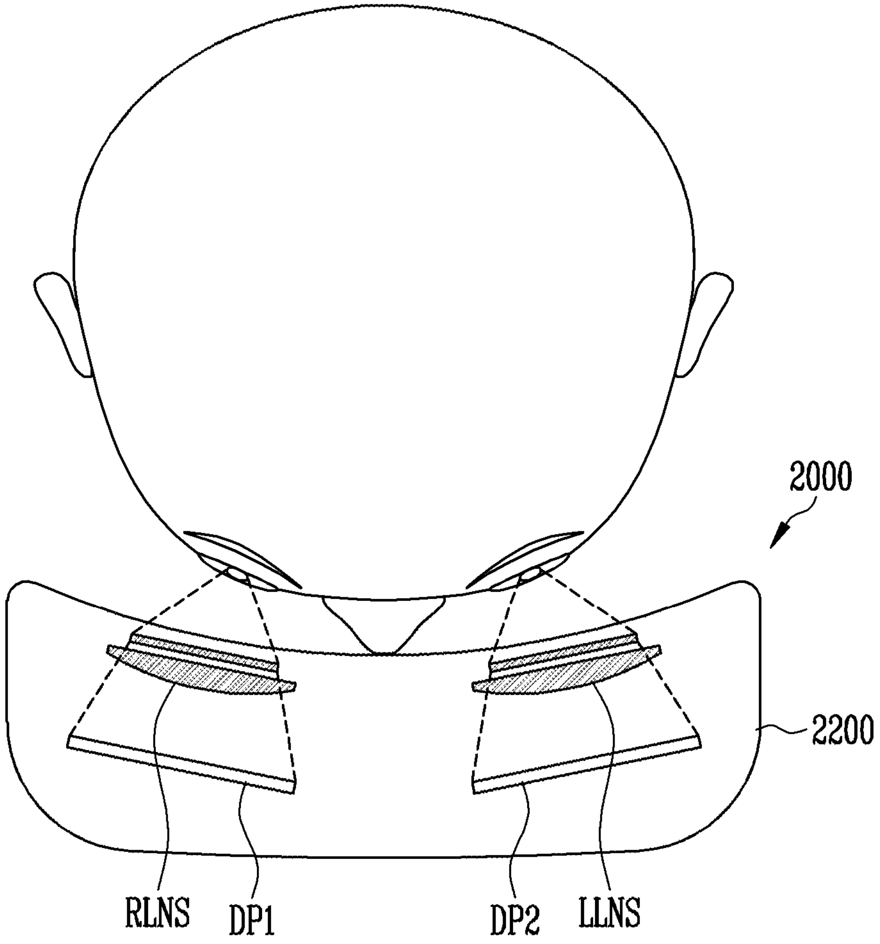
FIG. 18 is a drawing illustrating a head-mounted display device worn by a user of FIG. 17.

FIG. 18 is a diagram illustrating the head-mounted display device worn by a user of FIG. 17.

Referring to FIG. 18, in a head-mounted display device 2000, a first display panel DP1 of the first display device 1210 and a second display panel DP2 of the second display device 1220 are located. At this time, each of the first display panel DP1 and the second display panel DP2 may be located so that long sides of each of the first display panel DP1 and the second display panel DP2 are positioned in a horizontal direction based on the user's eyes. The head-mounted display device 2000 may further include one or more lenses LLNS and RLNS.

Within the display device receiving case 2200, the right eye lens RLNS may be located between the first display panel DP1 and a user's right eye. Within the display device receiving case 2200, the left eye lens LLNS may be located between the second display panel DP2 and a user's left eye.

An image output from the first display panel DP1 may be displayed to the user's right eye through the right eye lens RLNS. The right eye lens RLNS may refract light from the first display panel DP1 to be directed toward the user's right eye. The right eye lens RLNS may perform an optical function for adjusting a viewing distance between the first display panel DP1 and the user's right eye.

An image output from the second display panel DP2 may be displayed to the user's left eye through the left eye lens LLNS. The left eye lens LLNS may refract light from the second display panel DP2 to be directed toward the user's left eye. The left eye lens LLNS may perform an optical function for adjusting a viewing distance between the second display panel DP2 and the user's left eye.

In embodiments, each of the right eye lens RLNS and the left eye lens LLNS may include an optical lens having a pancake-shaped cross-section. In embodiments, each of the right eye lens RLNS and the left eye lens LLNS may include a multi-channel lens including sub-areas having different optical characteristics. In this case, each display panel may output images respectively corresponding to the sub-areas of the multi-channel lens, and the output images may pass through the respective corresponding sub-areas and may be viewed to the user.

Although embodiments and application examples have been described herein, other embodiments and modifications may be derived from the above description. Therefore, the spirit of the disclosure is not limited to these embodiments, and extends to the claims set forth below, various obvious modifications, and equivalents.

What is claimed is:

1. A display device comprising:

a display panel comprising sub-pixels electrically connected to gate lines, data lines, and auxiliary data lines, groups of multiples of the auxiliary data lines being respectively coupled to the data lines;

a gate driver on a side of the display panel, and configured to output gate signals to the gate lines; and a data driver configured to output data signals to the data lines through the auxiliary data lines.

2. The display device according to claim 1, wherein the data driver is on the side of the display panel on which the gate driver is located, or is on another side of the display panel that is opposite to the one side.

3. The display device according to claim 1, wherein the display panel has a long side extending in a first direction, and a short side extending in a second direction crossing the first direction, and wherein the data driver is on the short side.

4. The display device according to claim 3, wherein the gate lines and the auxiliary data lines extend in the first direction, and wherein the data lines extend in the second direction.

5. The display device according to claim 4, wherein the data lines are respectively electrically connected to at least one of the auxiliary data lines.

6. The display device according to claim 4, wherein the data lines comprise:

a first data line electrically connected to a first column of the sub-pixels;

a second data line electrically connected to a second column of the sub-pixels; and a third data line electrically connected to a third column of the sub-pixels, and wherein the auxiliary data lines comprise:

a first auxiliary data line electrically connected to the first data line;

a second auxiliary data line electrically connected to the second data line; and a third auxiliary data line electrically connected to the third data line.

7. The display device according to claim 4, wherein the data lines comprise a first data line electrically connected to a first column of the sub-pixels, and wherein one or more of the auxiliary data lines are electrically connected to the first data line through first contact holes.

8. The display device according to claim 4, wherein a number of the data lines corresponds to a number of columns of the sub-pixels, and wherein a number of the auxiliary data lines is a positive integer multiple of the number of the columns, the positive integer being two or more.

9. The display device according to claim 8, wherein the display panel comprises a silicon substrate.

10. The display device according to claim 9, wherein the display device is configured to provide virtual reality (VR) or augmented reality (AR).

11. A display device comprising:

a display panel having a long side extending in a first direction, and a short side extending in a second direction crossing the first direction, and comprising sub-pixels electrically connected to gate lines, auxiliary data lines extending in the first direction, and data lines extending in the second direction, and respectively electrically connected to groups of multiples of the auxiliary data lines through contact holes;

a gate driver on the short side of the display panel, and electrically connected to the gate lines; and a data driver on the short side of the display panel or on a side of the display panel that is opposite to the short side, and electrically connected to the data lines.

12. The display device according to claim 11, wherein the data lines comprise a first data line electrically connected to a first column of the sub-pixels, and wherein one or more of the auxiliary data lines are electrically connected to the first data line through first contact holes.

13. The display device according to claim 12, wherein a number of the data lines corresponds to a number of columns of the sub-pixels, and wherein a number of the auxiliary data lines is a positive integer multiple of the number of the columns, the positive integer being two or more.

14. The display device according to claim 13, wherein the display panel comprises a silicon substrate.

15. The display device according to claim 14, wherein the display device is configured to provide virtual reality (VR) or augmented reality (AR).

16. An electronic device comprising a display system comprising:

a processor; and a display device comprising:

a display panel comprising sub-pixels electrically connected to gate lines, data lines, and auxiliary data lines, groups of multiples of the auxiliary data lines being respectively coupled to the data lines;

a gate driver on a side of the display panel and configured to output gate signals to the gate lines; and a data driver parallel to the gate driver and configured to output data signals to the data lines through the auxiliary data lines.

17. The electronic device according to claim 16, wherein the data driver is on the side of the display panel on which the gate driver is located, or is on another side of the display panel that is opposite to the one side.

18. The electronic device according to claim 16, wherein the display panel has a long side extending in a first direction, and a short side extending in a second direction crossing the first direction, and wherein the data driver is on the short side.

19. The electronic device according to claim 18, wherein the gate lines and the auxiliary data lines extend in the first direction, and wherein the data lines extend in the second direction.

20. The electronic device according to claim 19, wherein the data lines are respectively electrically connected to at least one of the auxiliary data lines.

* * * * *